(12) United States Patent
Brunner et al.

(10) Patent No.: US 11,088,090 B1
(45) Date of Patent: Aug. 10, 2021

(54) PACKAGE COMPRISING A SUBSTRATE THAT INCLUDES A STRESS BUFFER LAYER

(71) Applicant: QUALCOMM Incorporated, San Diego, CA (US)

(72) Inventors: Sebastian Brunner, Deutschlandsberg (AT); Kurt Wiesbauer, Deutschlandsberg (AT); Horst Uwe Faulhaber, Tobelbad (AT); Florian Rak, Deutschlandsberg (AT); Andreas Haas, Deutschlandsberg (AT); Franz Tinauer, Deutschlandsberg (AT); Stefan Leitinger, Deutschlandsberg (AT); Gerhard Fuchs, Deutschlandsberg (AT)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/788,813

(22) Filed: Feb. 12, 2020

(51) Int. Cl.
| | | |
|---|---|---|
| *H01L 23/12* | (2006.01) |
| *H01L 23/34* | (2006.01) |
| *H01L 23/48* | (2006.01) |
| *H01L 21/00* | (2006.01) |
| *H01L 21/4763* | (2006.01) |
| *H01L 23/00* | (2006.01) |
| *H01L 23/31* | (2006.01) |
| *H01L 23/498* | (2006.01) |
| *H01L 21/48* | (2006.01) |

(Continued)

(52) U.S. Cl.
CPC .......... *H01L 23/562* (2013.01); *H01L 21/486* (2013.01); *H01L 21/4857* (2013.01); *H01L 21/56* (2013.01); *H01L 23/28* (2013.01); *H01L 23/3121* (2013.01); *H01L 23/49822* (2013.01); *H01L 23/49838* (2013.01); *H01L 23/49894* (2013.01); *H01L 23/5329* (2013.01); *H01L 23/5384* (2013.01); *H01L 23/5386* (2013.01)

(58) Field of Classification Search
CPC ... H01L 23/5329; H01L 23/28; H01L 23/538; H01L 23/5386; H01L 23/49816; H01L 23/49838; H01L 23/5384; H01L 21/4857; H01L 21/486; H01L 21/56; H01L 23/562; H01L 23/3121; H01L 23/49822; H01L 23/49894
See application file for complete search history.

(56) References Cited

U.S. PATENT DOCUMENTS 9,030,013 B2 *   5/2015   Peng ................. H01L 21/76834
                                                                257/758
9,196,529 B2    11/2015   Chen et al.
(Continued)

OTHER PUBLICATIONS

International Search Report and Written Opinion—PCT/US2021/014209—ISA/EPO—dated Apr. 12, 2021.

*Primary Examiner* — Alonzo Chambliss
(74) *Attorney, Agent, or Firm* — Qualcomm Incorporated

(57) ABSTRACT

A package that includes an integrated device, a substrate coupled to the integrated device, and an encapsulation layer coupled to the substrate. The encapsulation layer encapsulates the integrated device. The substrate includes at least one dielectric layer, a plurality of interconnects located in the at least one dielectric layer, a buffer dielectric layer coupled to the at least one dielectric layer, and a buffer interconnect located at least in the buffer dielectric layer.

23 Claims, 21 Drawing Sheets

PROFILE VIEW

(51) Int. Cl.
*H01L 23/532* (2006.01)
*H01L 21/56* (2006.01)
*H01L 23/28* (2006.01)
*H01L 23/538* (2006.01)

(56) References Cited

U.S. PATENT DOCUMENTS

| | | |
|---|---|---|
| 9,559,044 B2 | 1/2017 | Yang et al. |
| 9,793,243 B2 | 10/2017 | Lu et al. |
| 9,859,251 B2 | 1/2018 | Beer et al. |
| 2007/0238220 A1 | 10/2007 | Lii et al. |
| 2010/0163168 A1* | 7/2010 | Saita ................. H01L 23/49827 156/247 |
| 2014/0057080 A1 | 2/2014 | Iwakoshi et al. |
| 2016/0111380 A1 | 4/2016 | Sundaram et al. |
| 2016/0276237 A1 | 9/2016 | Lin et al. |
| 2019/0089044 A1* | 3/2019 | Kobuke ............ H01L 23/49822 |

* cited by examiner

PROFILE VIEW

PROFILE VIEW

PROFILE VIEW

PROFILE VIEW

PROFILE VIEW

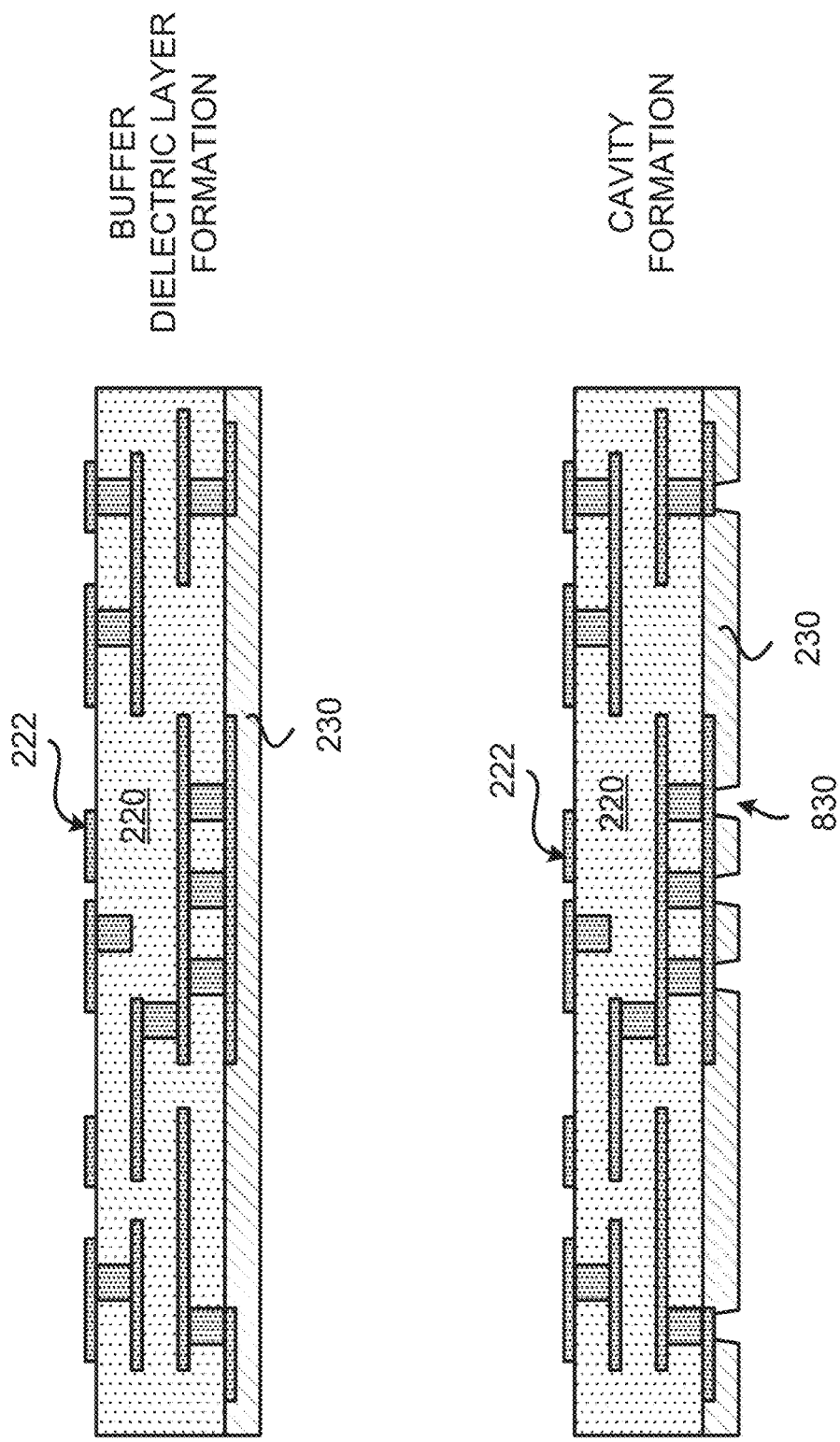

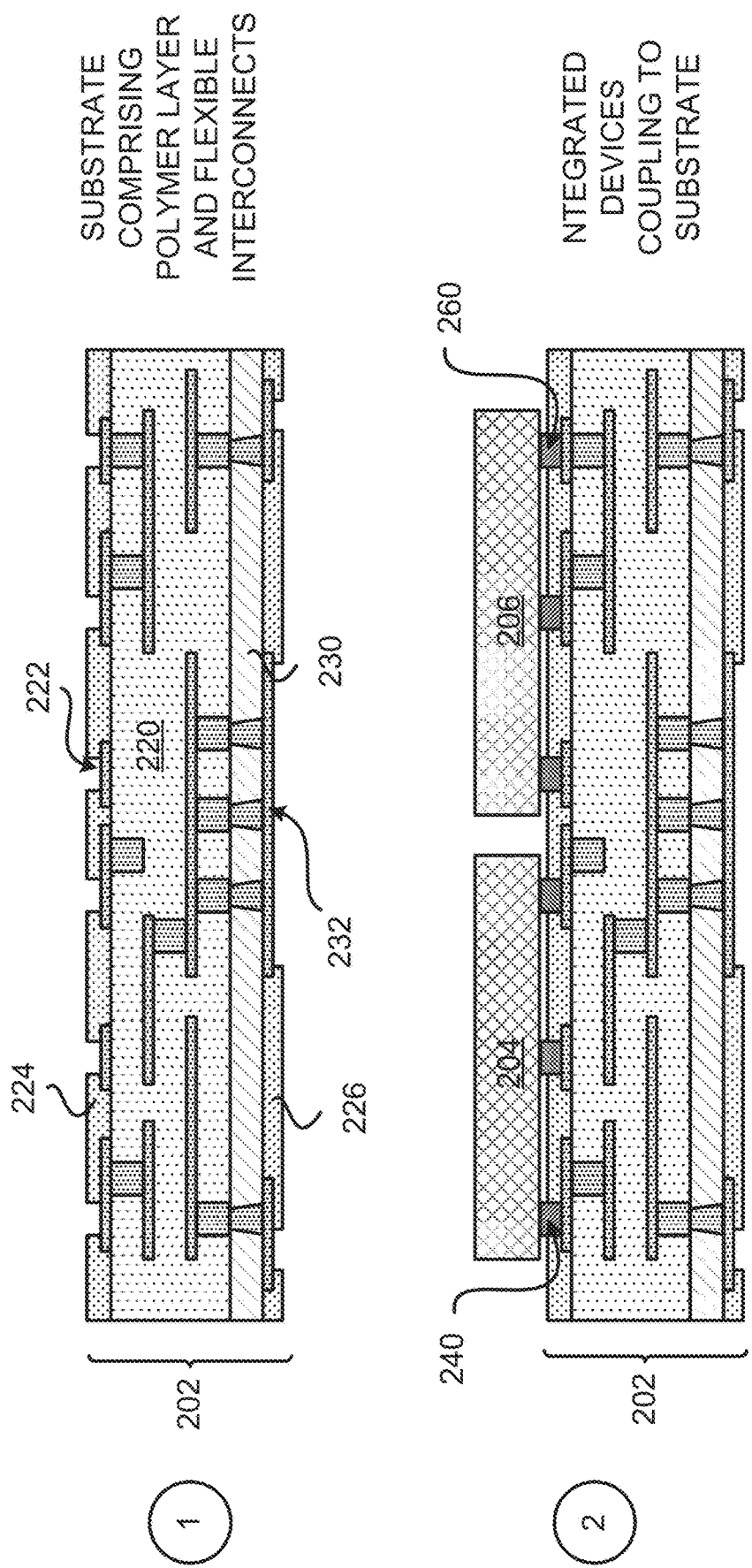

PACKAGE COMPRISING A SUBSTRATE THAT INCLUDES A STRESS BUFFER LAYER

FIELD

Various features relate to packages that include an integrated device, but more specifically to a package that includes an integrated device and a substrate that includes a stress buffer layer.

BACKGROUND

FIG. 1 illustrates a package 100 that includes a substrate 102, an integrated device 104, and an encapsulation layer 106. The substrate 102 includes at least one dielectric layer 120, a plurality of interconnects 122, and a plurality of solder interconnects 124. A plurality of solder interconnects 144 are coupled to the substrate 102 and the integrated device 104. The encapsulation layer 106 encapsulates the integrated device 104 and the plurality of solder interconnects 144. The package 100 may be prone to cracking, which can cause reliability issues with the package 100. There is an ongoing need to provide more reliable packages.

SUMMARY

Various features relate to packages that include an integrated device, but more specifically to a package that includes an integrated device and a substrate that includes a stress buffer layer.

One example provides a package that includes an integrated device, a substrate coupled to the integrated device, and an encapsulation layer coupled to the substrate. The encapsulation layer encapsulates the integrated device. The substrate includes at least one dielectric layer, a plurality of interconnects located in the at least one dielectric layer, a buffer dielectric layer coupled to the at least one dielectric layer, and a buffer interconnect located at least in the buffer dielectric layer.

Another example provides a substrate includes at least one dielectric layer, a plurality of interconnects located in the at least one dielectric layer, a buffer dielectric layer coupled to the at least one dielectric layer, and a buffer interconnect located at least in the buffer dielectric layer.

Another example provides an apparatus that includes an integrated device, a substrate coupled to the integrated device, and means for encapsulation coupled to the substrate. The means for encapsulation encapsulates the integrated device. The substrate includes at least one dielectric layer, a plurality of interconnects located in the at least one dielectric layer, means for stress buffering coupled to the at least one dielectric layer, a buffer interconnect located at least in the means for stress buffering.

Another example provides a method for fabricating a substrate. The method forms at least one dielectric layer. The method forms a plurality of interconnects in and over the at least one dielectric layer. The method forms a buffer dielectric layer over the at least one dielectric layer. The method forms a buffer interconnect at least in the buffer dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 8A-8C illustrate an exemplary sequence for fabricating a substrate having a stress buffer layer.

FIGS. 10A-10B illustrate an exemplary sequence for fabricating a package that includes a substrate having a stress buffer layer.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes an integrated device, a substrate coupled to the integrated device, and an encapsulation layer coupled to the substrate. The encapsulation layer encapsulates the integrated device. The substrate includes at least one dielectric layer, a plurality of interconnects located in the at least one dielectric layer, a buffer dielectric layer coupled to the at least one dielectric layer, and a buffer interconnect located at least in the buffer dielectric layer. A package may be subject to various stresses, which can cause failure in the package and/or joints in the packages (e.g., because of properties of certain dielectric layers), and ultimately can result in less reliable packages and/or packages with diminished performance. The use of one or more buffer dielectric layers enable the substrate and the package to be more resistant to stress (e.g., thermal stress, shock stress, mechanical stress, normal stress, shear stress), thus providing a more reliable package having better and/or higher performance.

Exemplary Package Comprising a Substrate Having a Stress Buffer Layer

Figure 1:
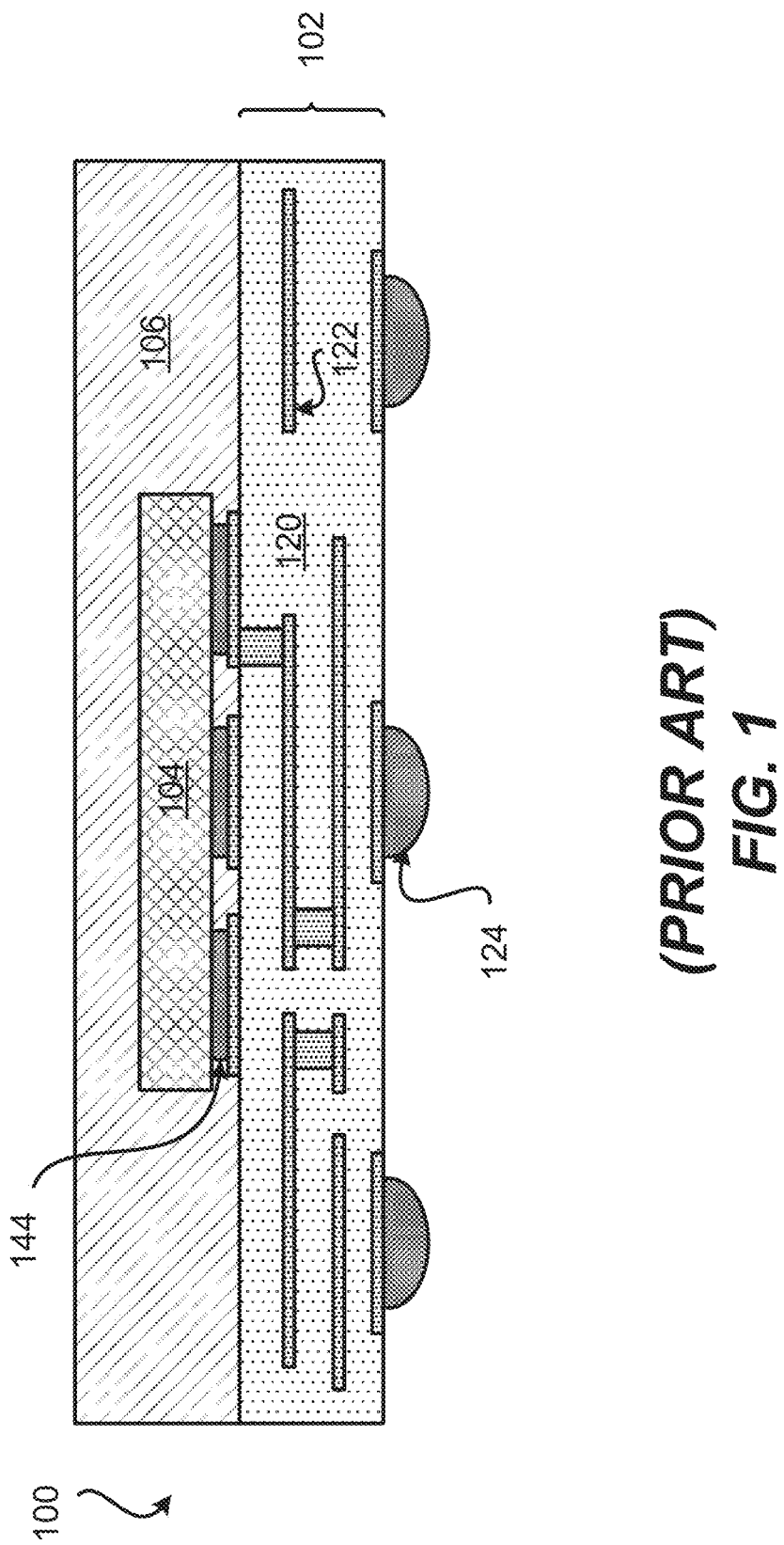
FIG. 1 illustrates a profile view of a package that includes an integrated device and a substrate.
Figure 2:
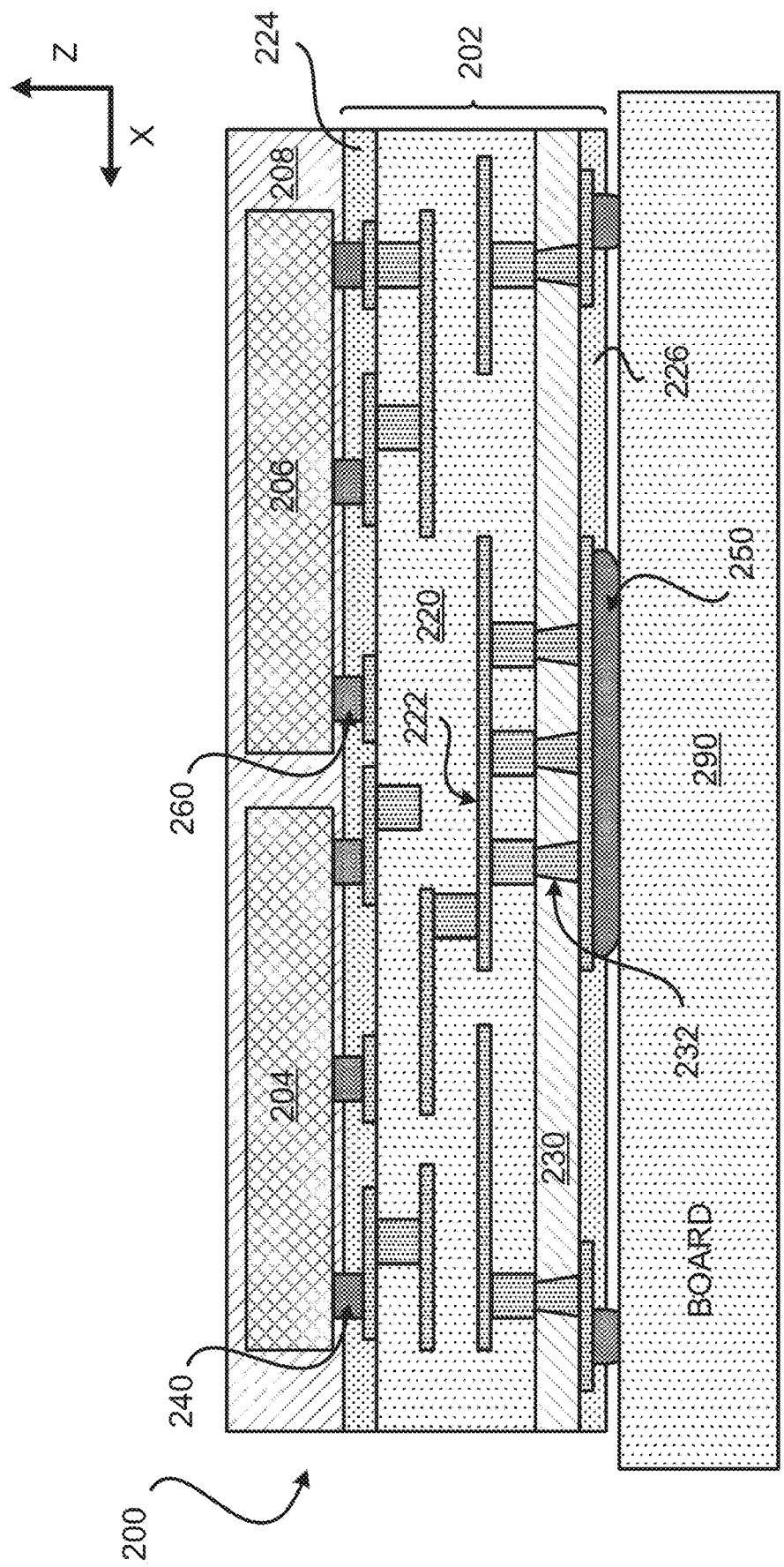
FIG. 2 illustrates a profile view of a package that includes a substrate having a stress buffer layer.

FIG. 2 illustrates a profile view of a package 200 that includes a substrate that comprises a stress buffer layer. As will be further described below, the stress buffer layer may be configured to absorb and alleviate stress being applied on the package 200, thus providing a more reliable package.

The package 200 is coupled to a board 290 (e.g., printed circuit board (PCB)) through a plurality of solder interconnects 250.

As shown in FIG. 2, the package 200 includes a substrate 202, a first integrated device 204, a second integrated device 206, and an encapsulation layer 208. The substrate 202 is coupled to the first integrated device 204 and the second integrated device 206. The first integrated device 204 and/or the second integrated device 206 may be dies (e.g., semiconductor dies). The encapsulation layer 208 is coupled to the substrate 202 such that the encapsulation layer 208 encapsulates the first integrated device 204 and/or the second integrated device 206. The encapsulation layer 208 may be a means for encapsulation.

The substrate 202 includes at least one dielectric layer 220, a plurality of interconnects 222, a first solder resist layer 224, a second solder resist layer 226, a buffer dielectric layer 230, and a plurality of buffer interconnects 232. The plurality of interconnects 222 is located (e.g., formed) in and/or over the at least one dielectric layer 220. The buffer dielectric layer 230 is coupled to the at least one dielectric layer 220. The plurality of buffer interconnects 232 is located in and/or over the buffer dielectric layer 230. The buffer dielectric layer 230 may be a means for stress buffering. The buffer dielectric layer 230 and the plurality of buffer interconnects 232 may be considered part of a stress buffer layer for the substrate 202. As will be further described below, the buffer dielectric layer 230 may be configured to absorb and alleviate stress being applied on the substrate 202 and/or the package 200. Examples of various stresses that the buffer dielectric layer 230 may be configured to absorb include (but not limited to) thermal stress, shock stress, mechanical stress, normal stress (e.g., compression, tension), and/or shear stress.

The substrate 202 may be a laminate substrate that includes dielectric layers as described above. In some implementations, the substrate 202 may include an organic substrate, glass (e.g., glass substrate) and/or quartz (e.g., quartz substrate). The buffer dielectric layer 230 may be coupled to the organic substrate, glass (e.g., glass substrate) and/or quartz (e.g., quartz substrate).

The first integrated device 204 is coupled to the substrate 202 through a plurality of solder interconnects 240. In particular, the first integrated device 204 is coupled to the plurality of interconnects 222 of the substrate 202 through the plurality of solder interconnects 240. The second integrated device 206 is coupled to the substrate 202 through a plurality of solder interconnects 260. In particular, the second integrated device 206 is coupled to the plurality of interconnects 222 of the substrate 202 through the plurality of solder interconnects 260.

The first solder resist layer 224 is located over a first surface (e.g., integrated device facing surface, top surface) of the substrate 202. For example, the first solder resist layer 224 may be formed over the at least one dielectric layer 220. The second solder resist layer 226 is located over a second surface (e.g., board facing surface, bottom surface) of the substrate 202. For example, the second solder resist layer 226 may be formed over the buffer dielectric layer 230. In some implementations, the first solder resist layer 224 and/or the second solder resist layer 226 may be optional.

The encapsulation layer 208 is coupled to a first surface (e.g., integrated device facing surface, top surface) of the substrate 202. The encapsulation layer 208 may be formed over the first solder resist layer 224 of the substrate 202. The encapsulation layer 208 may be coupled to the substrate 202 such that the encapsulation layer 208 encapsulates the first integrated device 204 and/or the second integrated device 206. The encapsulation layer 208 may include a mold, a resin, an epoxy and/or polymer.

In configuring and designing the package 200, there are a lot of factors and variables that are considered in order to provide a reliable, effective, and high performing package. The coupling of the package 200 to the board 290 is one factor that affects the reliability of the package 200. First, coupling the package 200 to the board 290 produces a lot of stress on the package 200, which can cause the package 200 to fail (e.g., cause cracks in the package 200, cause cracks in the solder joint). Thus, choosing a material that is strong and/or flexible enough to absorb these stresses is important. Second, different components of the package 200 and the board 290 may have different properties, including having different coefficient of thermal expansions (CTE), which can cause the package 200 to fail. Components that have different CTEs that are coupled together, may expand and contract at different rates. The different expansions and contractions of these components causes stresses on the components, neighboring components and/or the joints that couple the components. In many instances, these stresses are big enough to cause joint failures and/or cracks in the components and/or joints. The difference in the CTE between components may be referred to as a CTE mismatch or CTE difference. Thus, providing the right combination of materials having an appropriate CTE and Young's Modulus value is important. A Young's modulus value quantifies the resistance of a material to elastic (e.g., recoverable) deformation under load. A stiff material has a high Young's modulus value and changes its shape slightly under elastic loads. A flexible material has a low Young's modulus value and changes its shape considerably (e.g., relative to a material that has a high Young's modulus value).

In the case of the package 200 that is coupled to the board 290, the CTE of the integrated device (e.g., 204, 206), the CTE of the substrate 202 and the CTE of the board 290 may be evaluated in order to provide a reliable package 200 that is coupled to the board 290. Generally speaking, the CTE of the integrated device (e.g., 204, 206) is the lowest, and the CTE of the board 290 is the highest. In some implementations, when the integrated device (e.g., 204, 206) are tantalite (LT) based dies or lithium niobite (LN) based dies, the CTE of the integrated device may be similar to the CTE of the board 290 in at least one direction because LT and LN are very anisotropic in terms of CTE. The CTE of the substrate 202 may be somewhere in between the CTE of the integrated device (e.g., 204, 206) and the CTE of the board 290. If the CTE of the substrate 202 is too close to the CTE of the integrated device, then the CTE difference between the substrate 202 and the board 290 will be greater, resulting in a potential failure of a coupling joint between the substrate 202 and the board 290, and/or components near the substrate 202 and the board 290. If the CTE of the substrate 202 is too close to the CTE of the board 290, then the CTE difference between the substrate 202 and the integrated device will be greater, resulting in a potential failure of a coupling joint between the substrate 202 and the integrated device, and/or components near the substrate 202 and the integrated device.

In some implementations, the materials that are used for the substrate 202 to closely match the CTE of the integrated device may have a high Young's modulus value. For example, some dielectric layers for the substrate 202 may have a CTE that closely matches the CTE of an integrated device, but these materials may have a high Young's modulus value, and thus may be brittle and fail under high stress.

To address the potential CTE mismatch or CTE difference between the integrated device, the substrate 202 and the board 290, and the use of materials that are susceptible to cracks under stress, the substrate 202 may be divided into two portions with different properties (e.g., different CTE, different Young's Modulus). For example, the substrate 202 may include a stress buffer layer. In such implementations, the substrate 202 may include (i) a first portion that includes a CTE that is closer to the CTE of the integrated device, and (ii) a second portion that includes a property that allows the second portion to be configured to absorb and alleviate stress on the substrate 202. The second portion may include a material with a Young's Modulus that is low enough (e.g., material that is flexible enough) so that the second portion of the substrate 202 can be configured as a stress buffer layer for the substrate 202. In some implementations, (i) the first portion may include the at least one dielectric layer 220 and the plurality of interconnects 222, and (ii) the second portion of the substrate 202 may include the buffer dielectric layer 230 and the plurality of buffer interconnects 232. This configuration may help prevent cracks and chipping in the substrate 202 and/or the package 200, thus providing a reliable package 200.

Having described the importance of CTE values and Young's Modulus values for the package 200, various examples of materials, CTE values and Young's Modulus values are further described below.

The at least one dielectric layer 220 may include a low temperature co-fired ceramic (LTCC), a high temperature co-fired ceramic (HTCC), AlN, ZincOxide, and/or combinations thereof. The at least one dielectric layer 220 may include a Young's Modulus value of approximately 100-180 gigapascals (Gpa). The at least one dielectric layer 220 may include a coefficient of thermal expansion (CTE) of approximately 3-13 part per million per Kelvin (ppm/K).

The buffer dielectric layer 230 may include a polymer, polyimide (PI), benzocyclobutene (BCB), polybenzoxazole (PBO), epoxy, and/or combinations thereof. The buffer dielectric layer 230 may be a photo-imageable polymer and/or a non-photo-imageable polymer. The buffer dielectric layer 230 may include a Young's Modulus value of approximately 10 gigapascal (Gpa) or less. The buffer dielectric layer 230 may have a Young's Modulus value that is less than the Young's Modulus value of another dielectric layer (e.g., adjacent dielectric layer, the at least one dielectric layer 220). The buffer dielectric layer 230 may include a CTE of approximately 16-20 part per million per Kelvin (ppm/K). The buffer dielectric layer 230 may include one or more buffer dielectric layers. The buffer dielectric layer 230 is different from a solder resist layer, and is more flexible than a solder resist layer. The solder resist layer is usually more brittle than the buffer dielectric layer 230. It is noted that the values for Young's Modulus and/or the CTEs described in the disclosure are exemplary, and different implementations may use different values for the Young's Modulus and/or the CTEs. Thus, for example, the at least one dielectric layer may include (i) a first Young's Modulus value, and (ii) a first coefficient of thermal expansion (CTE), and the buffer dielectric layer may include (i) a second Young's Modulus value, and (ii) a second coefficient of thermal expansion (CTE). The first Young's Modulus value and the first coefficient of thermal expansion (CTE) for the at least one dielectric layer and/or the second Young's Modulus value and the second coefficient of thermal expansion (CTE) for the buffer dielectric layer may be configured to prevent cracks in the substrate and/or package. It is further noted that the ranges that are described may be inclusive of some or all possible values within the range. For example, the at least one dielectric layer 220 that includes a Young's Modulus value of approximately 100-180 gigapascals (Gpa) may include (i) a Young's Modulus value of approximately 110-170 gigapascals (Gpa), (ii) a Young's Modulus value of approximately 120-160 gigapascals (Gpa), (iii) a Young's Modulus value of approximately 130-150 gigapascals (Gpa), and/or (iv) a Young's Modulus value of approximately 140 gigapascals (Gpa).

The first integrated device 204 and/or the second integrated device 206 may include a radio frequency (RF) device, a passive device, a filter, a capacitor, an inductor, an antenna, a transmitter, a receiver, a GaAs based integrated device, a surface acoustic wave (SAW) filters (e.g., tantalite (LT) SAW filter, lithium niobite (LN) SAW filter), a bulk acoustic wave (BAW) filter, a light emitting diode (LED) integrated device, a silicon carbide (SiC) based integrated device, thin film capacitors, IPD integrated passive device and/or combinations thereof. In some implementations, the first integrated device 204 and/or the second integrated device 206 may be a silicon based integrated device (e.g., integrated device formed from a silicon-based substrate) that includes a CTE of approximately 2.6 part per million per Kelvin (ppm/K). In some implementations, a GaAs based integrated device may have a CTE of approximately 5.7-6.2 part per million per Kelvin (ppm/K).

In some implementations, the first integrated device 204 and/or the second integrated device 206 may have a CTE that is as close as possible to the CTE of the at least one dielectric layer 220. The package 200 may be designed to reduce or minimize the CTE mismatch or CTE difference between an integrated device and the dielectric layer of the substrate 202. In some implementations, a CTE mismatch or CTE difference between an integrated device (e.g., the first integrated device 204, the second integrated device 206) and the at least one dielectric layer 220 is approximately 7.4 part per million per Kelvin (ppm/K) or less. In some implementations, the board 290 may have a CTE of approximately 14-16 part per million per Kelvin (ppm/K).

Figure 3:
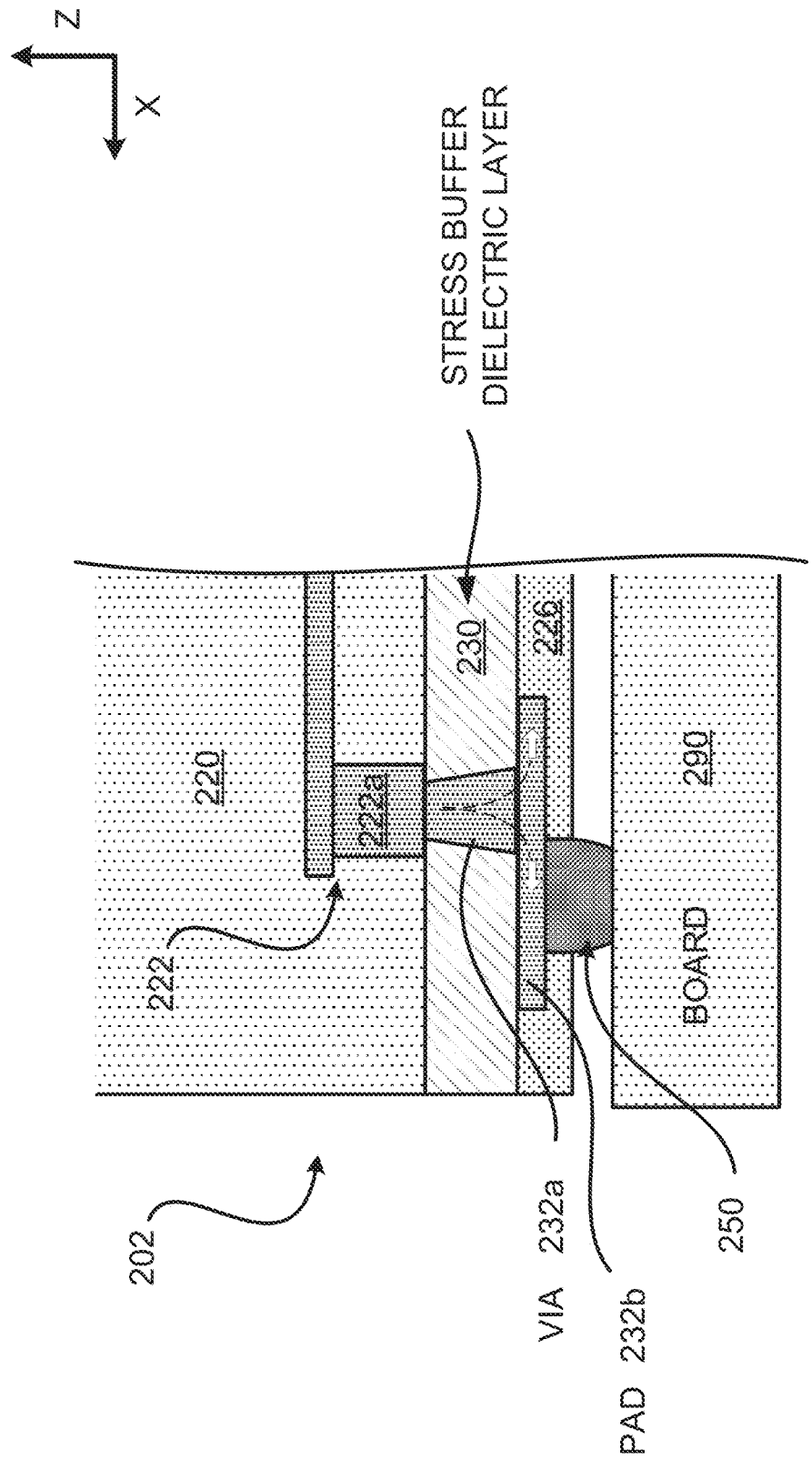
FIG. 3 illustrates a profile view of a close-up view of a package that includes a substrate having a stress buffer layer.

FIG. 3 illustrates a close-up view of the substrate 202 coupled to the board 290. As shown in FIG. 3, the buffer dielectric layer 230 is coupled to the at least one dielectric layer 220 and located over the at least one dielectric layer 220. A buffer via 232a is formed and located in the buffer dielectric layer 230. The buffer via 232a is a type of an interconnect. The buffer via 232a is coupled to an interconnect (e.g., via 222a) from the plurality of interconnects 222. A buffer pad 232b is located over the buffer dielectric layer 230. The buffer pad 232b is a type of interconnect. The buffer pad 232b is coupled to the buffer via 232a. In some implementations, the buffer via 232a and the buffer pad 232b may be considered part of the same interconnect. The via buffer 232a and the buffer pad 232b may be considered part of the plurality of buffer interconnects 232. A solder interconnect 250 is coupled to the buffer pad 232b and an interconnect from the board 290. As shown in FIG. 3, the use of the buffer dielectric layer 230 allows the buffer via 232a and the buffer pad 232b to be flexible, thus helping reduce the likelihood of interconnects of the substrate 202 from failing (e.g., cracking). For example, the use of the buffer dielectric layer 230 (which as described above, includes a flexible material that has a low Young's modulus value and can changes its shape considerably), may allow the plurality of buffer interconnects 232, the buffer via 232a and/or the buffer pad 232b to be flexible (e.g., the buffer interconnect, buffer via, buffer pad may move with the buffer dielectric layer 230). In at least some implementations, the plurality of buffer interconnects 232, the buffer via 232a and/or the buffer pad 232b may be one or more buffer interconnects located in and/or over at least one buffer dielectric layer (e.g., 230).

Figure 4:
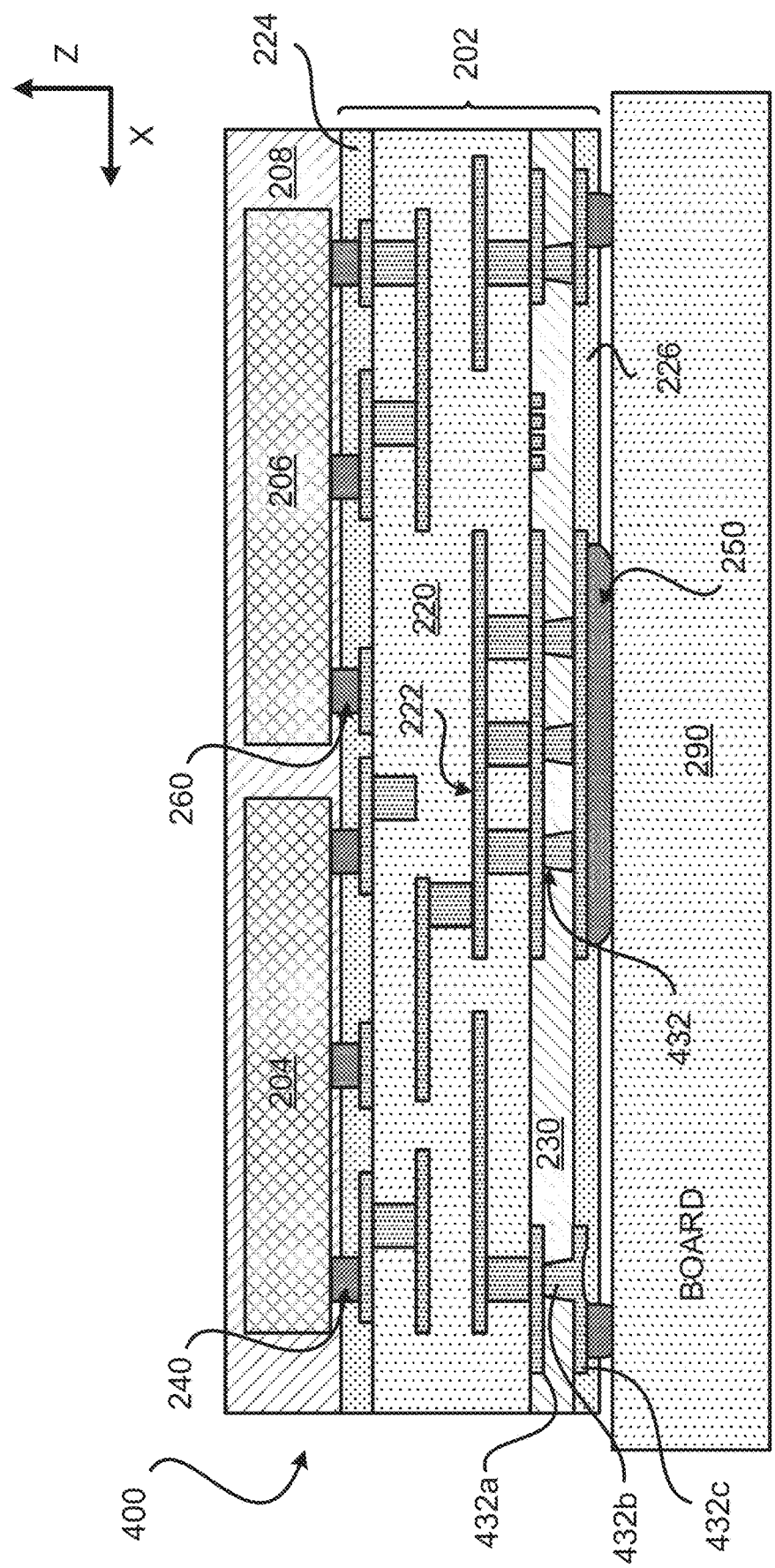
FIG. 4 illustrates a profile view of another package that includes a substrate having a stress buffer layer.

Different implementations may include different configurations and/or arrangements of materials and/or components. FIG. 4 illustrates a profile view of a package 400 that includes a substrate that comprises a stress buffer layer. The package 400 may be similar to the package 200 of FIG. 2, and thus the package 400 includes similar components as the package 200. The package 400 includes the substrate 202, the first integrated device 204, the second integrated device 206 and the encapsulation layer 208.

As shown in FIG. 4, the substrate 202 includes the at least one dielectric layer 220, the plurality of interconnects 222, the buffer dielectric layer 230, a plurality of buffer interconnects 432, the first solder resist layer 224 and the second solder resist layer 226. The plurality of buffer interconnects 432 is coupled to the plurality of interconnects 222 and the plurality of solder interconnects 250.

The plurality of buffer interconnects 432 includes a buffer pad 432a (e.g., first buffer pad), a buffer via 432b and a buffer pad 432c (e.g., second buffer pad). The buffer pad 432a is coupled to an interconnect from the plurality of interconnects 222. The buffer via 432b is coupled to the buffer pad 432a and the buffer pad 432c. The buffer pad 432c is coupled to the solder interconnect 250. The buffer pad 432c may include a dimple. FIG. 4 illustrates an example of solder mask defined (SMD) coupling regions for the buffer interconnects 432 and the solder interconnect 250. Thus, the openings in the second solder resist layer 226 over a buffer interconnect specify where the solder interconnect 250 is coupled to (e.g., where the solder interconnect wets to the buffer interconnect).

Figure 5:
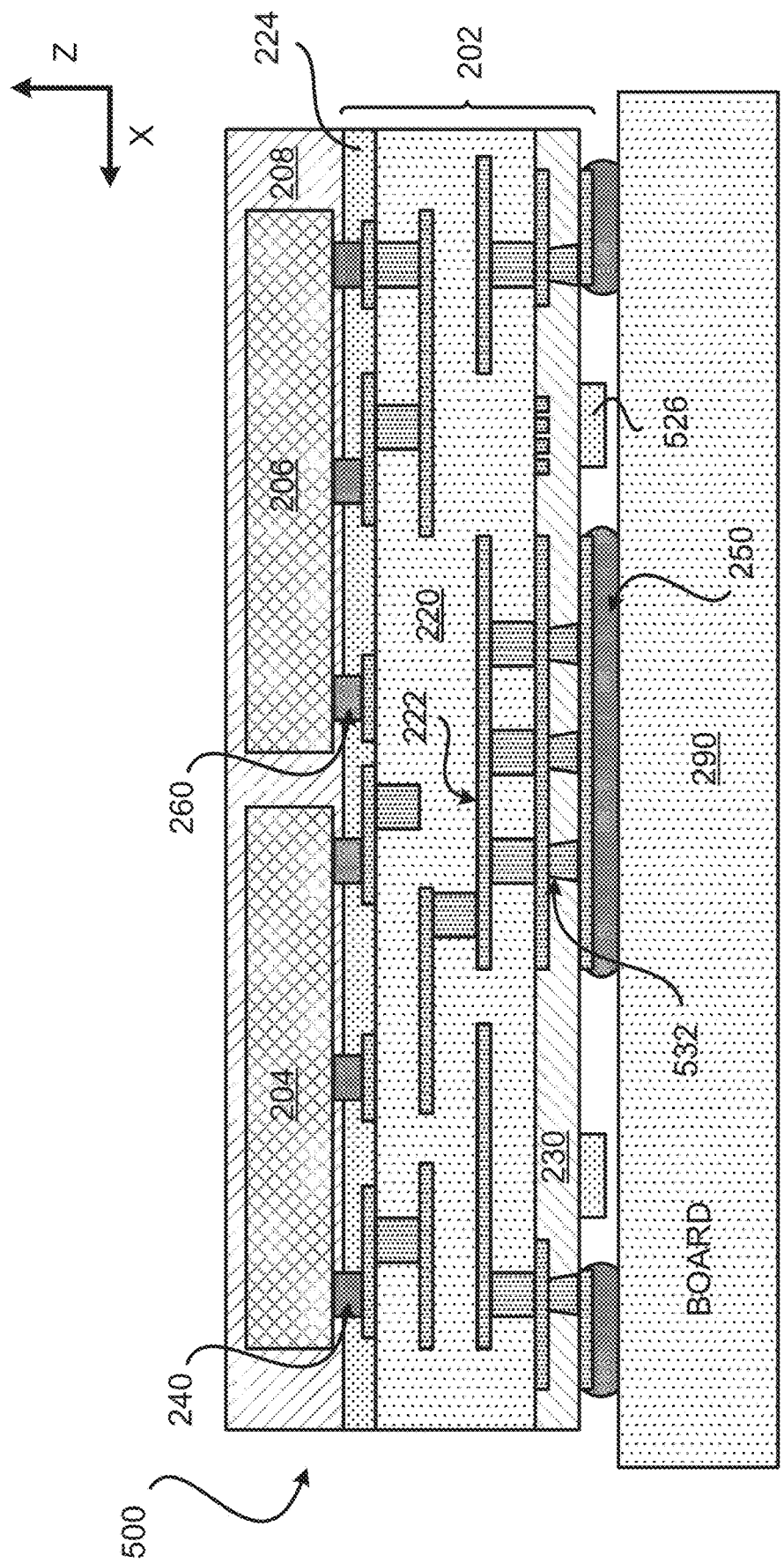
FIG. 5 illustrates a profile view of another package that includes a substrate having a stress buffer layer.

In some implementations, non-solder mask defined (NSMD) may be used on the package. FIG. 5 illustrates a profile view of a package 500 that includes a substrate that comprises a stress buffer layer. The package 500 may be similar to the package 200 of FIG. 2 and/or the package 400 of FIG. 4, and thus the package 500 includes similar components as the package 200 and/or the package 400. The package 500 includes the substrate 202, the first integrated device 204, the second integrated device 206 and the encapsulation layer 208.

As shown in FIG. 5, the substrate 202 includes the at least one dielectric layer 220, the plurality of interconnects 222, the buffer dielectric layer 230, a plurality of buffer interconnects 532, the first solder resist layer 224 and the second solder resist layer 526. The second solder resist layer 526 may be optional. The plurality of buffer interconnects 532 is coupled to the plurality of interconnects 222 and the plurality of solder interconnects 250.

In FIG. 5, the second solder resist layer 526 is formed over only a small portion of the buffer dielectric layer 230. The second solder resist layer 526 is not formed over the buffer interconnects 532. The second solder resist layer 526 is not used to specify where the plurality of solder interconnect 250 is allowed to couple to (e.g., wet) the plurality of buffer interconnects 532. In some implementations, there may not be the second solder resist layer 536 and/or the first solder resist layer 224.

FIGS. 2-5 illustrate the buffer dielectric layer 230 and the plurality of buffer interconnects (e.g., 232, 432, 532) located over the second surface (e.g., board facing surface, bottom surface) of the substrate 202. However, in some implementations, the buffer dielectric layer 230 and the plurality of buffer interconnects (e.g., 232, 432, 532) may also be located over the first surface (e.g., integrated device facing surface, top surface) of the substrate 202. In such implementations, the first integrated device 204 and/or the second integrated device 206 may be coupled to top buffer interconnects of the substrate 202.

Figure 6:
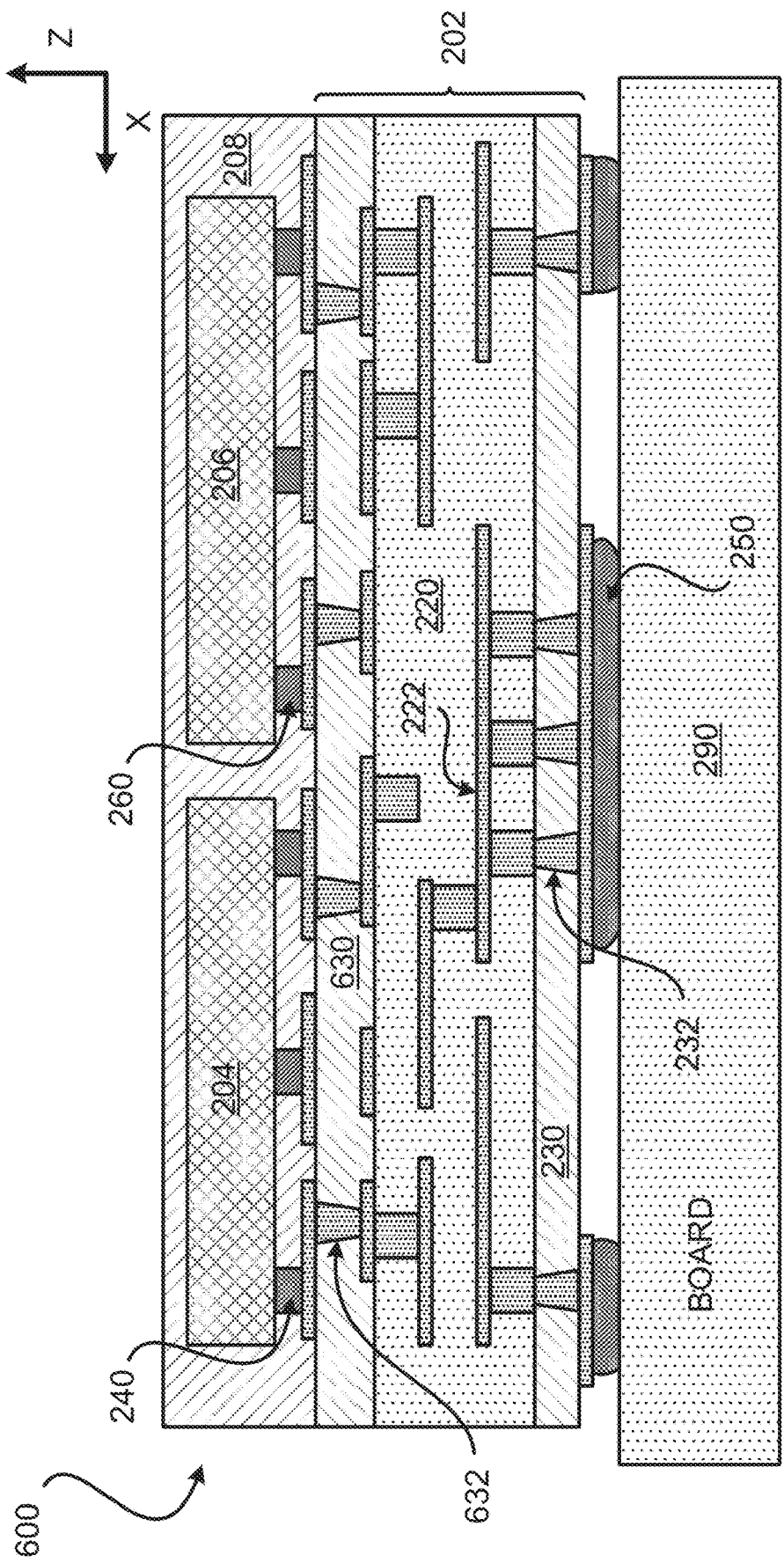
FIG. 6 illustrates a profile view of another package that includes a substrate having a stress buffer layer.

FIG. 6 illustrates a profile view of a package 600 that includes a substrate that comprises a stress buffer layer. The package 600 may be similar to the package 200 of FIG. 2, the package 400 of FIG. 4, and/or the package 500 of FIG. 5, thus the package 600 includes similar components as the packages 200, 400, and/or 500. The package 600 includes the substrate 202, the first integrated device 204, the second integrated device 206 and the encapsulation layer 208. The package 600 includes two stress buffer layers (e.g., top stress buffer layer, bottom stress buffer layer).

As shown in FIG. 6, the substrate 202 includes the at least one dielectric layer 220, the plurality of interconnects 222, the buffer dielectric layer 230, a plurality of buffer interconnects 232, and a buffer dielectric layer 630, and a plurality of buffer interconnects 632. The plurality of buffer interconnects 232 is coupled to the plurality of interconnects 222 and the plurality of solder interconnects 250. The buffer dielectric layer 630 is located over the first surface (e.g., integrated device facing surface, top surface) of the substrate 202. The buffer dielectric layer 630 is located between the integrated device (e.g., 204, 206) and the at least one dielectric layer 220. The plurality of buffer interconnects 632 is coupled to the plurality of interconnects 222 and the plurality of solder interconnects (e.g., 240, 260). The buffer dielectric layer 630 may be similar to the buffer dielectric layer 230, and as such may be configured to absorb stress being applied on the integrated devices (e.g., 204, 206), the substrate 202 and/or the package (e.g., 200, 400, 500). In some implementations, the buffer dielectric layer (e.g., 230, 630) may also be configured to operate as a protection layer, a shielding layer and/or a reflection layer for the package. The buffer dielectric layer (e.g., 230, 630) may be one of at least several buffer dielectric layers. For examples, one or more additional buffer dielectric layers may be formed over the buffer dielectric layer 230 and/or the buffer dielectric layer 630, Each buffer dielectric layer may include at least one buffer interconnect located in and/or over the buffer dielectric layer. In some implementations, the buffer dielectric layer (e.g., 230, 630) may conceptually represent one or more buffer dielectric layers. Thus, a buffer dielectric layer as described in the disclosure, may be considered as at least one dielectric layer.

Having described various different packages with a substrate having a stress buffer layer, a sequence for fabricating a substrate that includes a stress buffer layer will now be described below.

Exemplary Sequence for Fabricating a Substrate Comprising a Stress Buffer Layer

FIGS. 7A-7F illustrate an exemplary sequence for providing or fabricating a substrate that includes a stress buffer layer. In some implementations, the sequence of FIGS. 7A-7F may be used to provide or fabricate the substrate 202 of FIG. 2, or any of the substrates described in the disclosure.

It should be noted that the sequence of FIGS. 7A-7F may combine one or more stages in order to simplify and/or clarify the sequence for providing or fabricating the substrate. In some implementations, the order of the processes may be changed or modified. In some implementations, one or more of processes may be replaced or substituted without departing from the scope of the disclosure. As will be further described below, a tape casting process may be used to form the substrate.

Figure 7A:
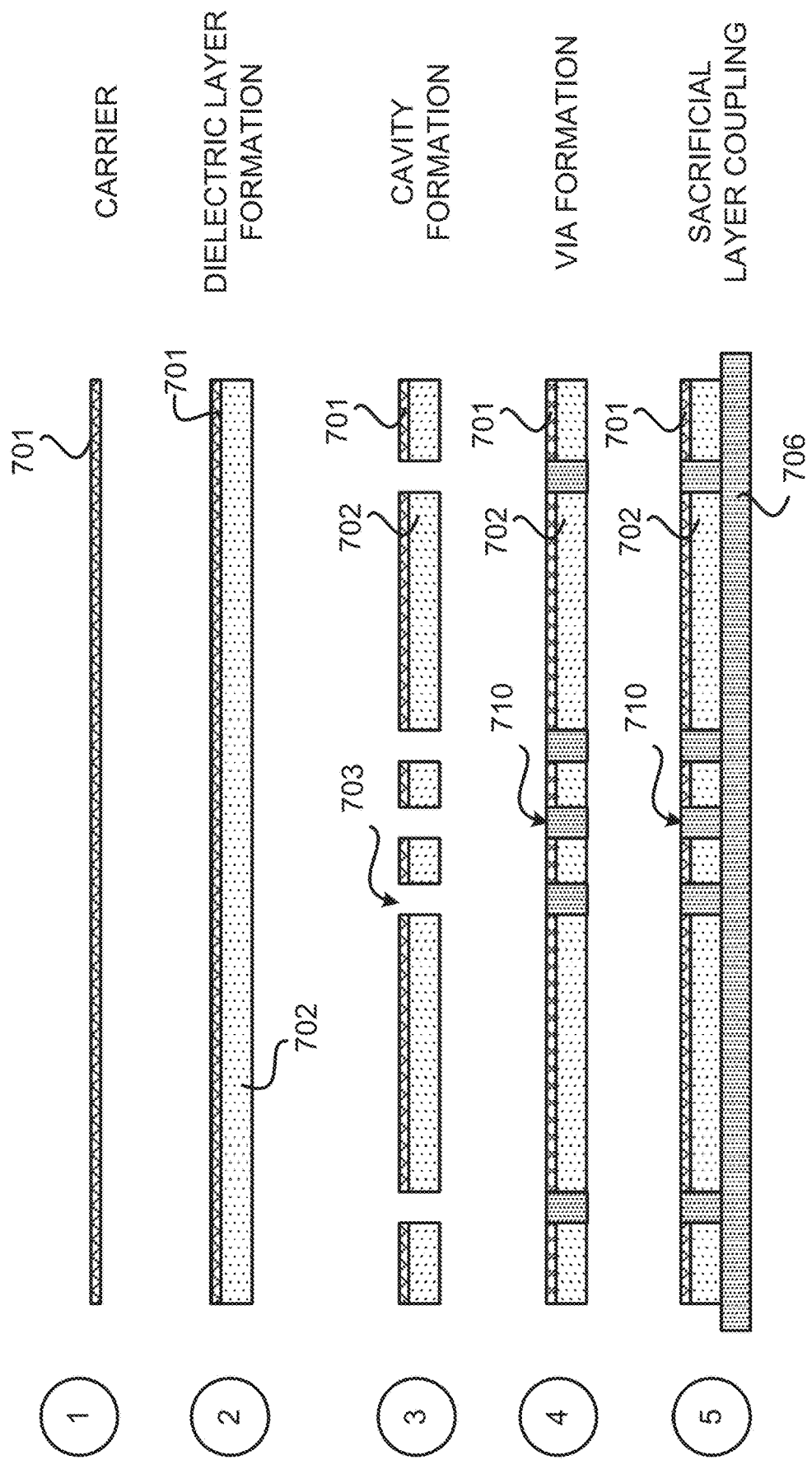
FIGS. 7A-7F illustrate an exemplary sequence for fabricating a substrate having a stress buffer layer.

Stage 1, as shown in FIG. 7A, illustrates a state after a carrier 701 is provided. The carrier 701 may be a holding plane on which a dielectric layer or material may be disposed. The carrier 701 may be a carrier tape for tape casting. The carrier 701 may include glass, metal, coated paper, polymer, and/or combinations thereof.

Stage 2 illustrates a state after the dielectric layer 702 is disposed (e.g., formed) over the carrier 701. The dielectric layer 702 may be a slurry (e.g., ceramic slurry) that is disposed over the carrier 701. The slurry may be dried to form the dielectric layer 702. The dielectric layer 702 may not be sintered.

Stage 3 illustrates a state after cavities 703 are formed through the carrier 701 and the dielectric layer 702. A needle punching process may be used to form the cavities through the carrier 701 and the dielectric layer 702. In such an instance, a needle may be used to punch cavities (e.g., 703) through the carrier 701 and the dielectric layer 702.

Stage 4 illustrates a state after interconnects (e.g., vias) 710 are formed in the cavities 703 of the dielectric layer 702 and the carrier 701. Different implementations may form the interconnects 710 differently. In some implementations, a stencil filing process may be used to form the interconnects 710 in the cavities 703. In some implementations, a silver (Ag) paste is used to fill the cavities 703 to form the interconnects 710.

Stage 5 illustrates a state after the dielectric layer 702 and the carrier 701 are coupled to a sacrificial layer 706. For example, the sacrificial layer 706 may be coupled to the dielectric layer 702 and/or the interconnects 710.

Figure 7B:
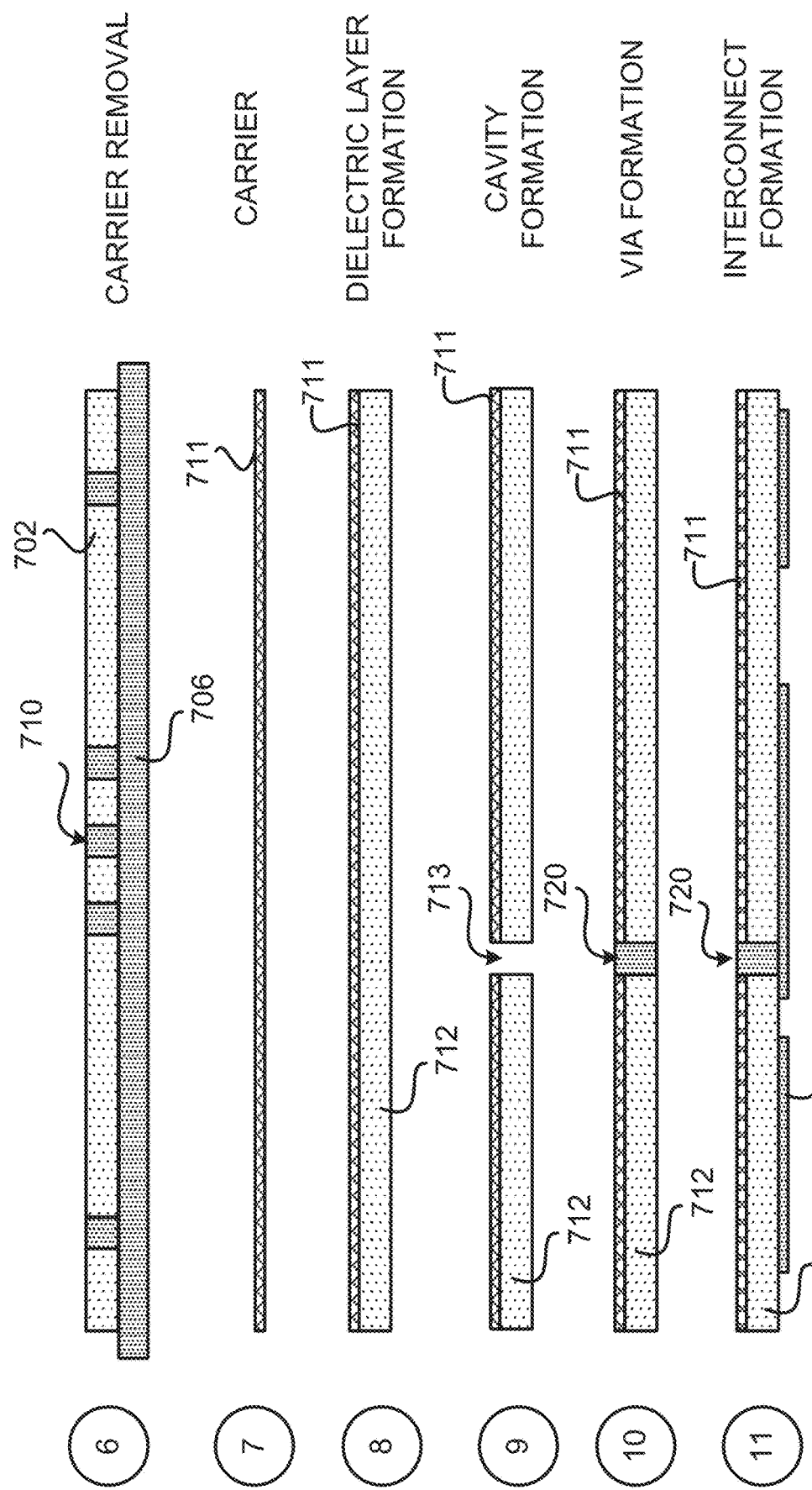

Stage 6, as shown in FIG. 7B, illustrates a state after the carrier 701 is removed. For example, the carrier 701 may be peeled off from the dielectric layer 702 and the interconnects 710.

Stage 7 illustrates a state after a carrier 711 is provided. The carrier 711 may be a holding plane on which a dielectric layer or material may be disposed. The carrier 711 may be a carrier tape for tape casting. The carrier 711 may include glass, metal, coated paper, polymer, and/or combinations thereof.

Stage 8 illustrates a state after the dielectric layer 712 is disposed (e.g., formed) over the carrier 711. The dielectric layer 712 may be a slurry (e.g., ceramic slurry) that is disposed over the carrier 711. The slurry may be dried to form the dielectric layer 712. The dielectric layer 712 may not be sintered. The dielectric layer 712 may be similar to the dielectric layer 702.

Stage 9 illustrates a state after cavities 713 are formed through the carrier 711 and the dielectric layer 712. A needle punching process may be used to form the cavities through the carrier 711 and the dielectric layer 712. In such an instance, a needle may be used to punch cavities (e.g., 713) through the carrier 711 and the dielectric layer 712.

Stage 10 illustrates a state after interconnects (e.g., vias) 720 are formed in the cavities 713 of the dielectric layer 712 and the carrier 711. Different implementations may form the interconnects 720 differently. In some implementations, a stencil filing process may be used to form the interconnects 720 in the cavities 713. In some implementations, a silver (Ag) paste is used to fill the cavities 713 to form the interconnects 720.

Stage 11 illustrates a state after interconnects 722 are formed over the dielectric layer 712 and/or the interconnects 720. In some implementations, a silver (Ag) paste is used to print interconnects 722 over the dielectric layer 712 and/or the interconnects 720.

Figure 7C:
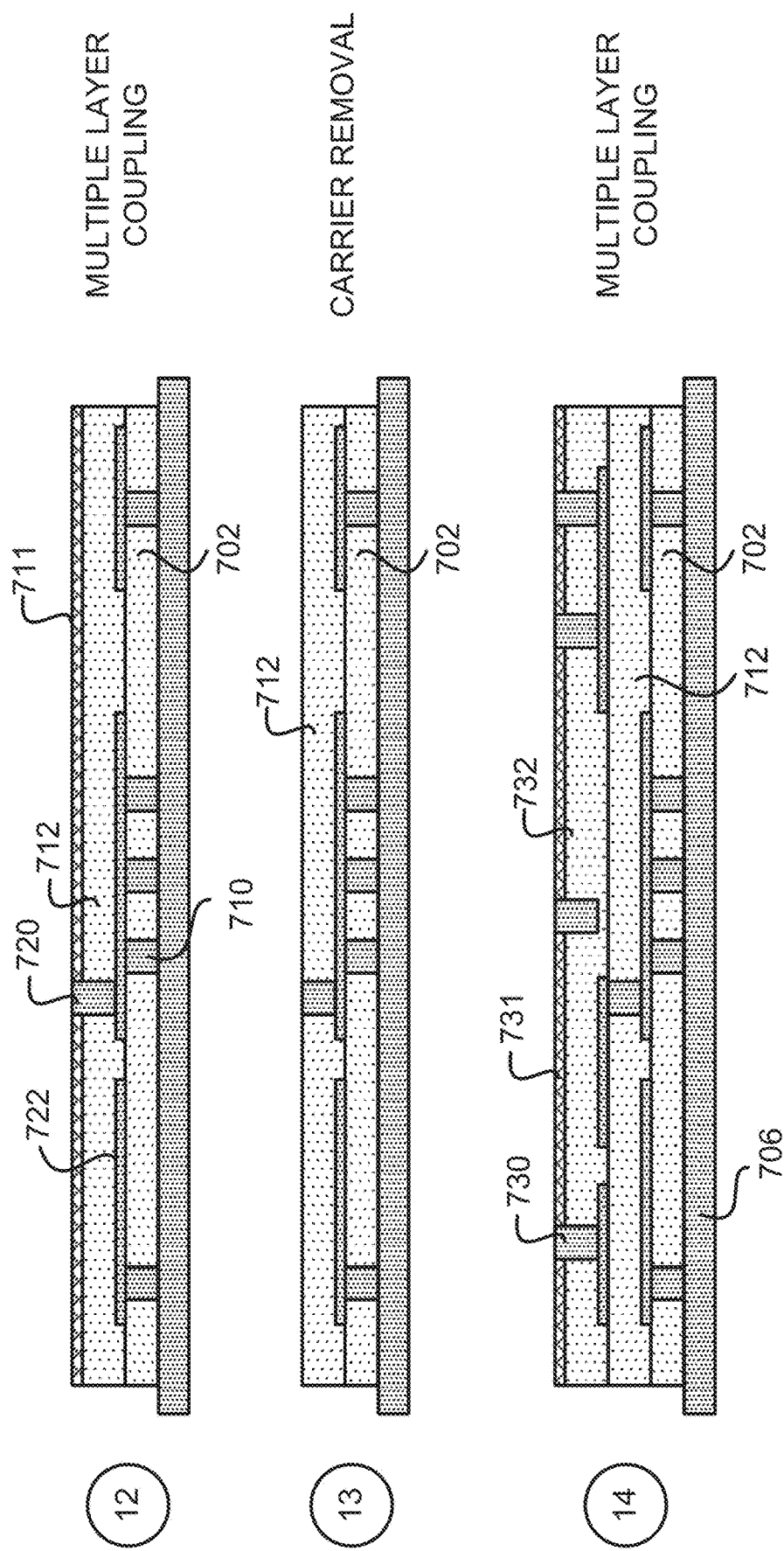

Stage 12, as shown in FIG. 7C, illustrates a state where the dielectric layer 712, the interconnects 720, the interconnects 722 and the carrier 711 are coupled to the dielectric layer 702, the interconnects 710 and the sacrificial layer 706. The dielectric layer(s) (e.g., 702, 712) may include $Al_2O_3$. However, different implementations may use different materials for the dielectric layer(s) (e.g., 702, 712).

Stage 13 illustrates a state after the carrier 711 is removed. For example, the carrier 711 may be peeled off from the dielectric layer 712 and the interconnects 720.

Stage 14 illustrates a state where the dielectric layer 732, the interconnects 730, and the carrier 731 are coupled to the dielectric layer 712 and the interconnects 720. The dielectric layer 732, the interconnects 730 and the carrier 731 may be formed using a process similar to what is described in Stages 7-11 of FIG. 7B. The dielectric layer(s) (e.g., 702, 712, 732) may include $Al_2O_3$. However, different implementations may use different materials for the dielectric layer(s) (e.g., 702, 712, 732). The interconnects (e.g., 710, 720, 722, 730) may include silver. However different implementations may use different materials (e.g., electrically conductive materials) for the interconnects (e.g., 710, 720, 722, 730) of a substrate. The carrier 731 may be similar to the carrier 701 and/or the carrier 711.

Figure 7D:
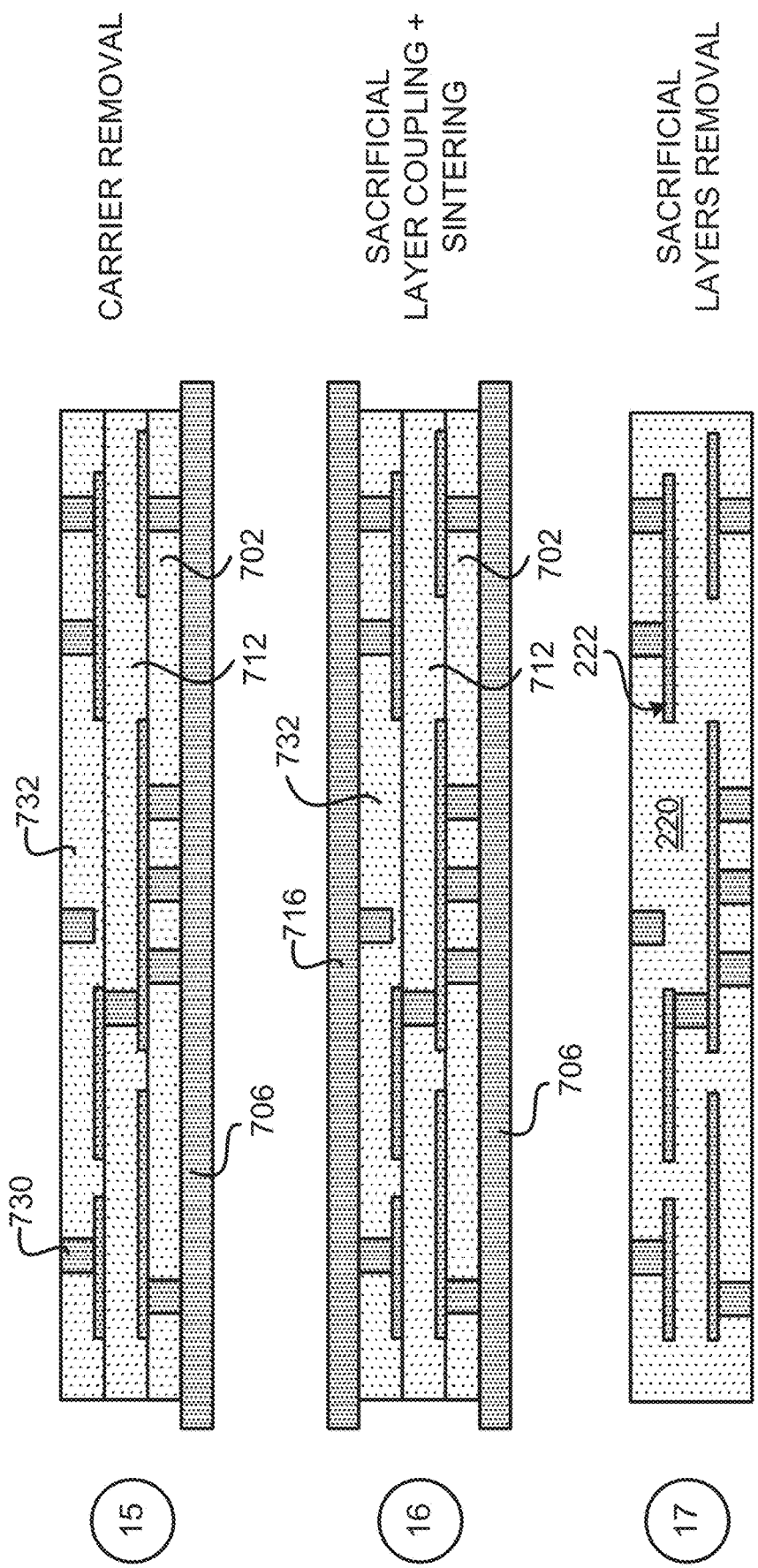

Stage 15, as shown in FIG. 7D, illustrates a state after the carrier 731 is removed. For example, the carrier 731 may be peeled off from the dielectric layer 732 and the interconnects 730.

Stage 16 illustrates a state after a sacrificial layer 716 is coupled to the dielectric layer 732 and the interconnects 730. Stage 16 may also illustrate a state after sintering. In some implementations, sintering includes coalescing the dielectric layers (702, 712, 732). Coalescing the dielectric layers (702, 712, 732) may form a dielectric layer 220. Sintering may include heating the dielectric layers and/or interconnects. In some implementations, sintering may reduce the thickness of the dielectric layers and/or the interconnects. A curing process (e.g., firing process, binder burn-out process) may be used for sintering the at least one dielectric layer and the interconnects.

Stage 17 illustrates a state after sintering and after the sacrificial layer 706 and the sacrificial layer 716 have been removed. As mentioned above, sintering includes coalescing the dielectric layers (702, 712, 732). Coalescing the dielectric layers (702, 712, 732) may form the dielectric layer 220. The dielectric layer 220 may include one or more dielectric layers. The interconnects 710, 720, 722 and 730 may be represented as the plurality of interconnects 222. In some implementations, the sacrificial layers (e.g., 706, 716) may be removed mechanically with a glass granulate (e.g., pellets, fine particles like sand) blasting process. In some implementations, the sacrificial layers (e.g., 706, 716) may be optional, and sintering can be performed as free sintering where the dielectric layers and interconnects shrink with a certain value (e.g. 30%). When sintering is performed with the sacrificial layer(s), this may be referred as constrained sintering, where the sacrificial layer (which may include $Al_2O_3$) prevents shrinking in x and y direction. Stages 1-17 of FIG. 7A-7D, illustrate one example of an LTCC process. However, any other LTCC process or any other substrate (e.g., Glass, LT, LN, Quartz, PCB, ZnO, Si, AlN, ZrO2) can be used in this disclosure. For example, $Al_2O_3$ may be used as part of a hybrid substrate.

Figure 7E:
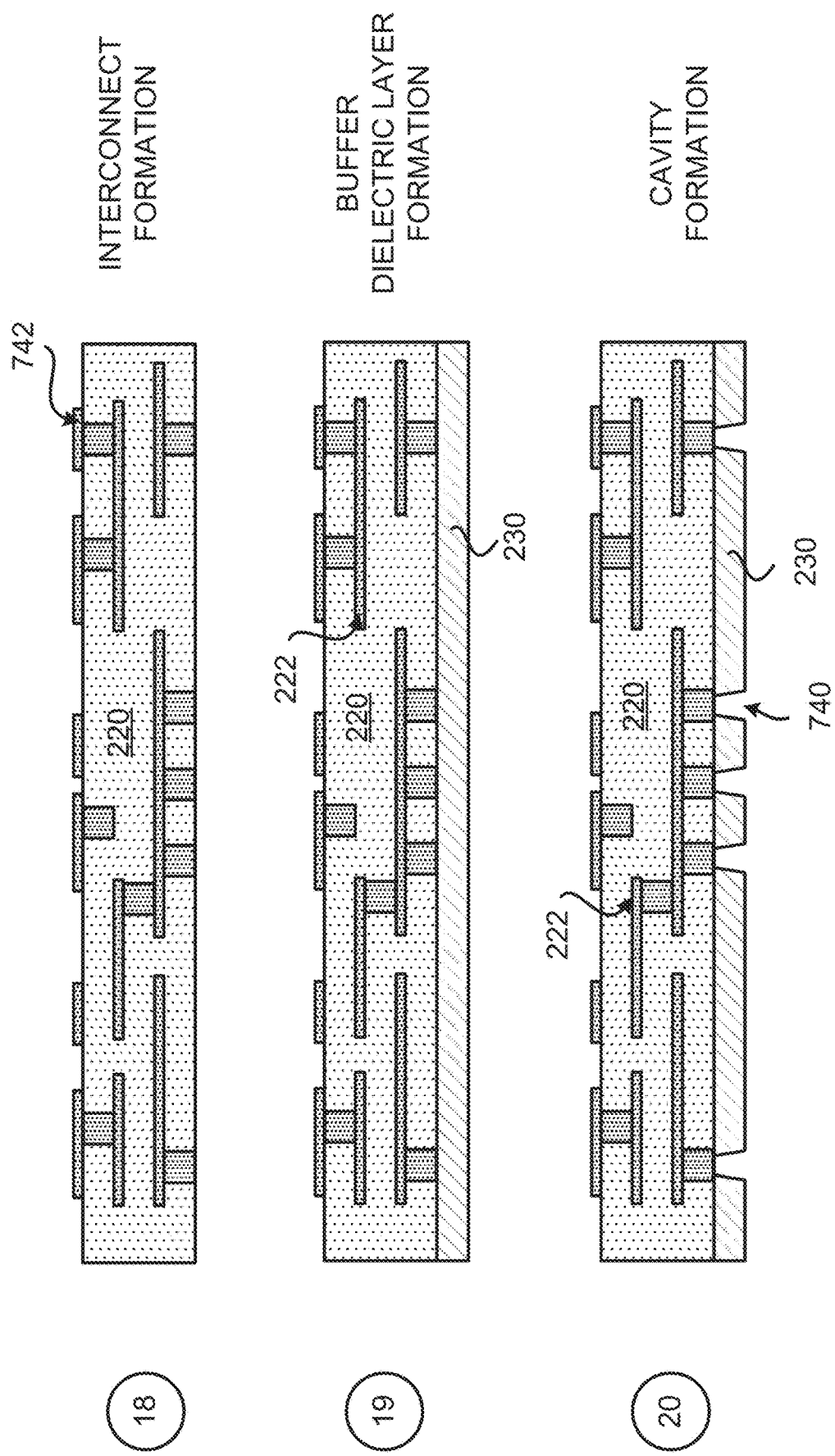

Stage 18, as shown in FIG. 7E, illustrates a state after interconnects 742 are disposed (e.g., formed) over the at least one dielectric layer 220. Different implementations may form the interconnects 742 differently. For example, a sputtering process, a spray coating, and/or a plating process may be used to form the interconnects 742. The interconnects 742 may be optional. The interconnects 742 may be considered part of the plurality of interconnects 222.

Stage 19 illustrates a state after a buffer dielectric layer 230 is formed over the at least one dielectric layer 220. A lamination process may be used to form the buffer dielectric layer 230.

Stage 20 illustrates a state after cavities 740 are formed in the buffer dielectric layer 230. An etching process (e.g. photo etching process) and/or a laser process may be used to form the cavities 740 in the buffer dielectric layer 230.

Figure 7F:
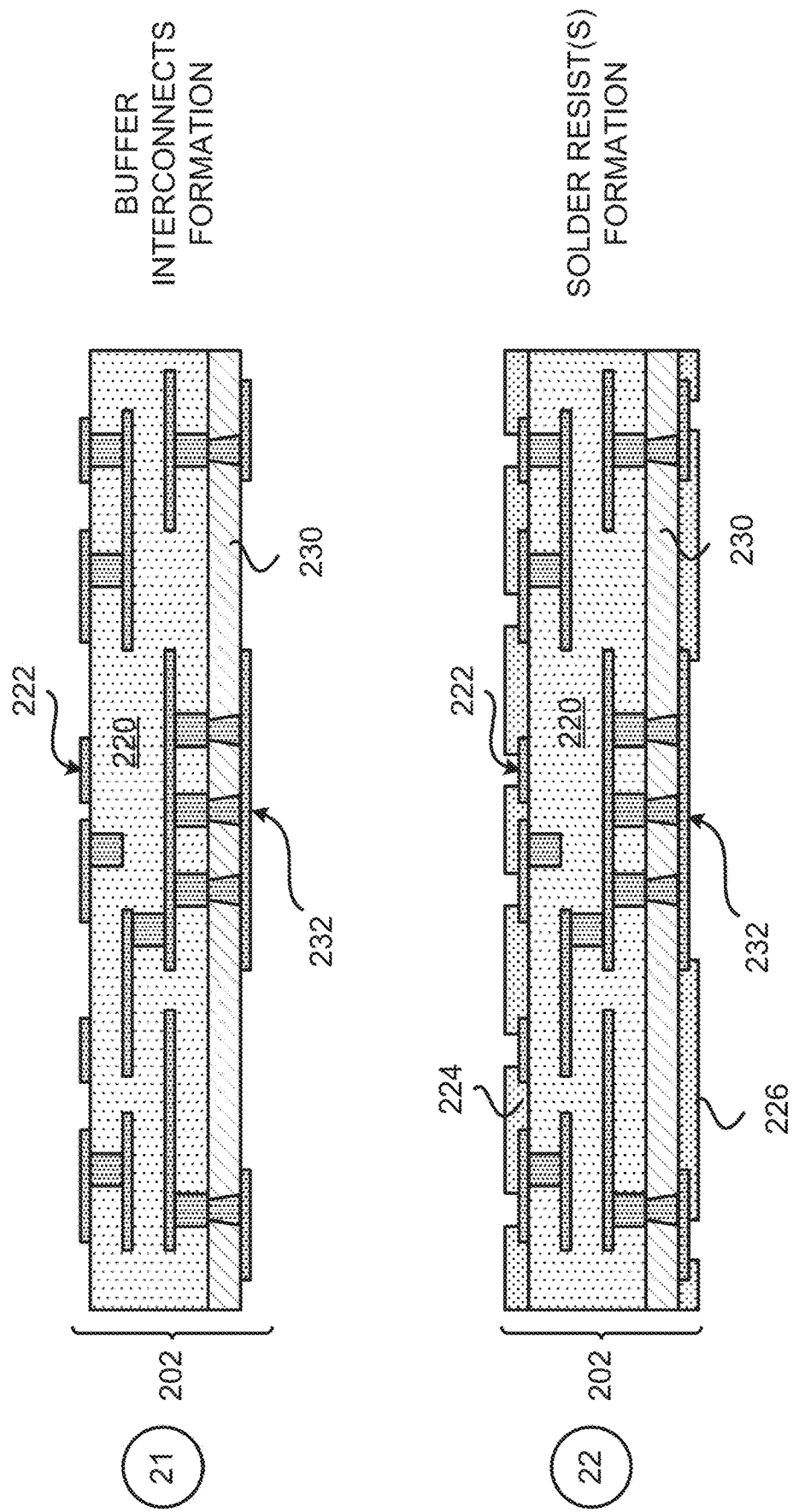

Stage 21, as shown in FIG. 7F, illustrates a state after a plurality of buffer interconnects 232 is formed in and over the buffer dielectric layer 230. Different implementations may form the plurality of buffer interconnects 232 differently. For example, a sputtering process, a spray coating, and/or a plating process may be used to form the plurality of buffer interconnects 232.

Stage 22 illustrates a state after solder resist layers are formed over the at least one dielectric layer 220 and the buffer dielectric layer 230. For example, a first solder resist layer 224 may be formed over the at least one dielectric layer 220, and a second solder resist layer 226 may be formed over the buffer dielectric layer 230. Stages 18 and 19 may illustrate examples of the substrate 202.

Exemplary Sequence for Fabricating a Substrate Comprising a Stress Buffer Layer

Figure 8A:
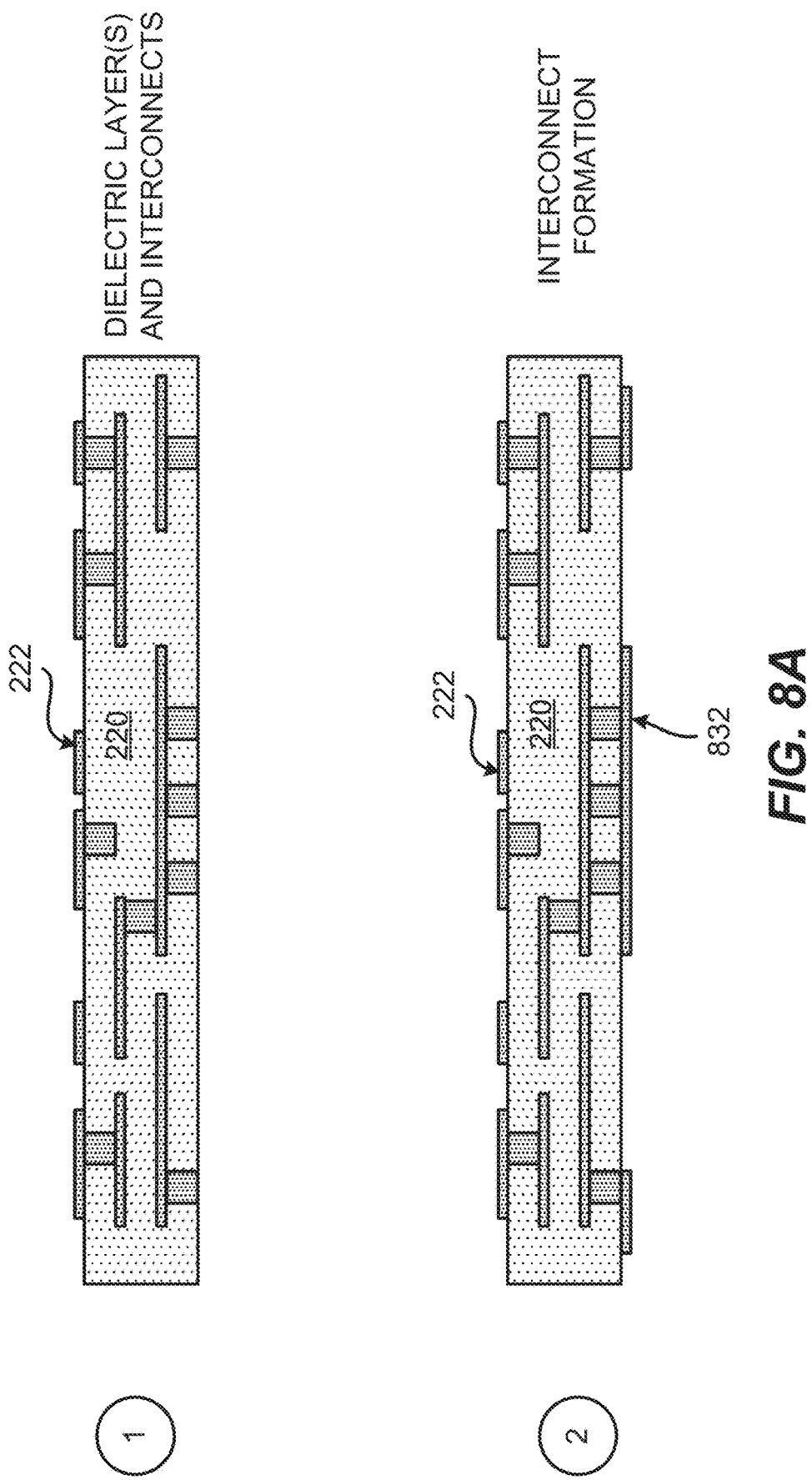
Figure 8C:
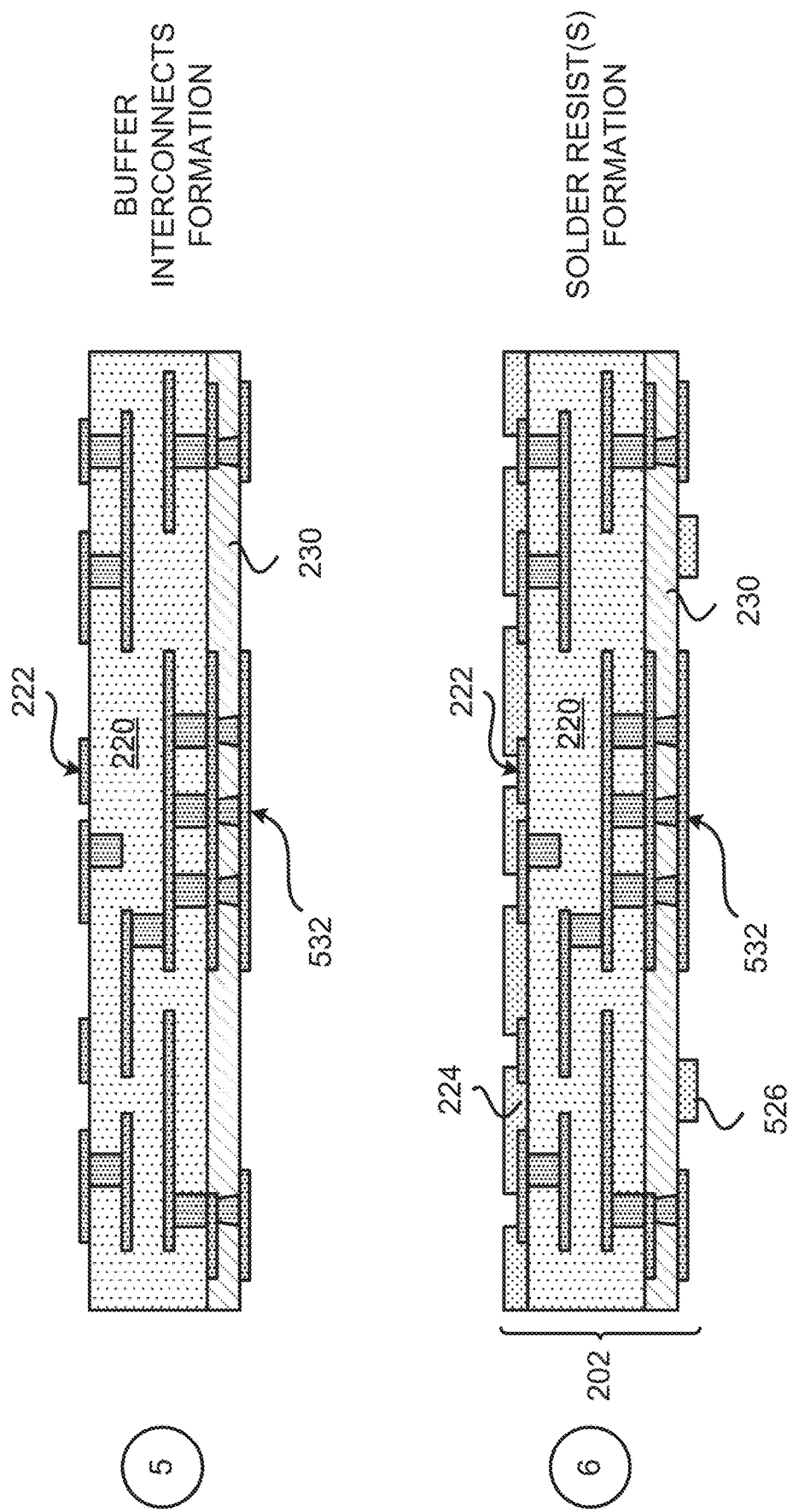

FIGS. 8A-8C illustrate an exemplary sequence for providing or fabricating a substrate that includes a stress buffer layer. In some implementations, the sequence of FIGS. 8A-8C may be used to provide or fabricate the substrate 202 of FIG. 5, or any of the substrates described in the disclosure.

It should be noted that the sequence of FIGS. 8A-8C may combine one or more stages in order to simplify and/or clarify the sequence for providing or fabricating the substrate. In some implementations, the order of the processes may be changed or modified. In some implementations, one or more processes may be replaced or substituted without departing from the scope of the disclosure.

Stage 1, as shown in FIG. 8A, illustrates a state after the at least one dielectric layer 220 and the plurality of interconnects 222 are formed. Stages 1-18 of FIGS. 7A-7E illustrate an example of a sequence for fabricating the at least one dielectric layer 220 and the plurality of interconnects 222.

Stage 2 illustrates a state after a plurality of interconnects 832 is formed over the at least one dielectric layer 220. Different implementations may form the plurality of interconnects 832 differently. For example, a sputtering process, a spray coating, and/or a plating process may be used to form the plurality of interconnects 832. The plurality of interconnects 832 may be considered part of the plurality of interconnects 222.

Stage 3, as shown in FIG. 8B, illustrates a state after a buffer dielectric layer 230 is formed over the at least one dielectric layer 220 and the plurality of interconnects 832. A lamination process may be used to form the buffer dielectric layer 230.

Stage 4 illustrates a state after cavities 830 are formed in the buffer dielectric layer 230. An etching process (e.g. photo etching process) and/or a laser process may be used to form the cavities 830 in the buffer dielectric layer 230.

Stage 5, as shown in FIG. 8C, illustrates a state a plurality of buffer interconnects 532 is formed in and over the buffer dielectric layer 230. Different implementations may form the plurality of buffer interconnects 532 differently. For example, a sputtering process, a spray coating, and/or a plating process may be used to form the plurality of buffer interconnects 532.

Stage 6 illustrates a state after solder resist layers are formed over the at least one dielectric layer 220 and the buffer dielectric layer 230. For example, a first solder resist layer 224 may be formed over the at least one dielectric layer 220, and a second solder resist layer 526 may be formed over the buffer dielectric layer 230. Stages 5 and 6 may illustrate examples of the substrate 202 of FIG. 5.

Figure 9:
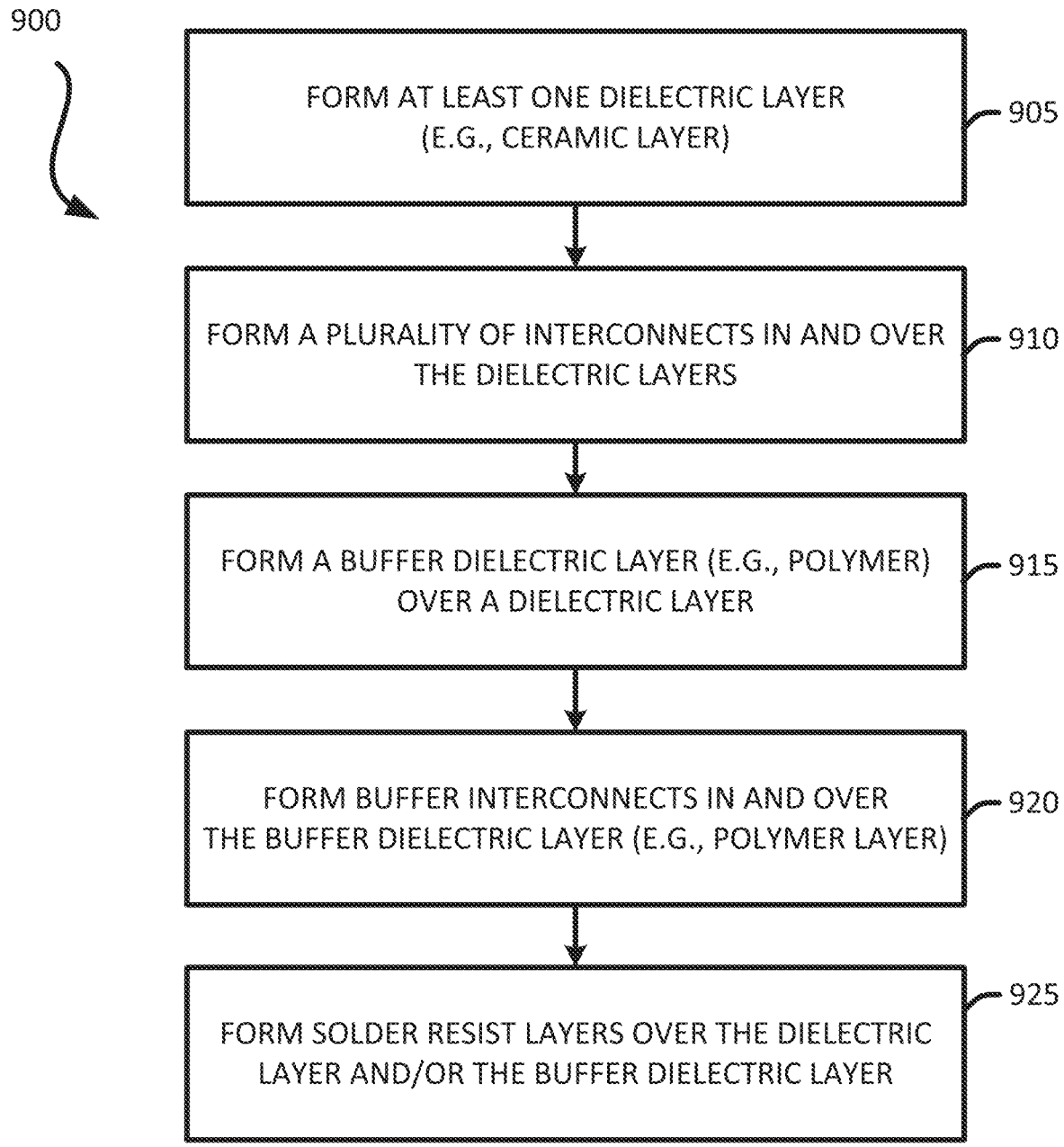
FIG. 9 illustrates an exemplary flow diagram of a method for fabricating a substrate having a stress buffer layer.

Exemplary Flow Diagram of a Method for Fabricating a Substrate Having a Stress Buffer Layer In some implementations, fabricating a substrate that includes a stress buffer layer includes several processes. FIG. 9 illustrates an exemplary flow diagram of a method 900 for providing or fabricating a substrate that includes a stress buffer layer. In some implementations, the method 900 of FIG. 9 may be used to provide or fabricate the substrate 202 of FIG. 2 described in the disclosure. However, the method 900 may be used to provide or fabricate any of the substrates described in the disclosure.

It should be noted that the sequence of FIG. 9 may combine one or more processes in order to simplify and/or clarify the method for providing or fabricating a substrate that includes a stress buffer layer. In some implementations, the order of the processes may be changed or modified.

The method forms (at 905) one or more dielectric layers (e.g., 220). Forming one or more dielectric layers may include using a lamination process and/or a tape casting process. Stages 1-14 of FIGS. 7A-7D, illustrate and describe examples of forming one or more dielectric layers.

The method forms (at 910) a plurality of interconnects (e.g., 222) in and over the dielectric layers (e.g., 220). Forming the plurality of interconnects may include using a stencil filing process. However, different implementations may use different processes for forming the plurality of interconnects. Stages 1-18 of FIGS. 7A-7E, illustrate and describe examples of forming a plurality of interconnects.

The method forms (at 915) a buffer dielectric layer (e.g., 230) over the at least one dielectric layer (e.g., 220). The buffer dielectric layer may be coupled to the at least one dielectric layer. The buffer dielectric layer may be formed over a first surface and/or a second surface of the at least one dielectric layer. Forming the buffer dielectric layer may include creating cavities in the buffer dielectric layer. Stages 19-20 of FIG. 7E, illustrate and describe an example of forming a buffer dielectric layer.

The method forms (at 920) a plurality of buffer interconnects (e.g., 232) in and over the buffer dielectric layer (e.g., 230). Different implementations may form the plurality of buffer interconnects differently. For example, a sputtering process, a spray coating, and/or a plating process may be used to form the plurality of buffer interconnects. Stage 21 of FIG. 7F, illustrates an example of forming a plurality of buffer interconnects.

The method forms (at 925) solder resist layer(s) (e.g., 224, 226) over the at least one dielectric layer (e.g., 220) and/or the buffer dielectric layer (e.g., 230). A first solder resist layer may be formed over a first surface of a substrate, and a second solder resist layer may be formed over a second surface of the substrate. For example, a first solder resist layer 224 may be formed over the at least one dielectric layer 220, and a second solder resist layer 526 may be formed over the buffer dielectric layer 230. Stage 22 of FIG. 7F, illustrates an example of forming solder resist layers over a substrate.

Figure 10B:
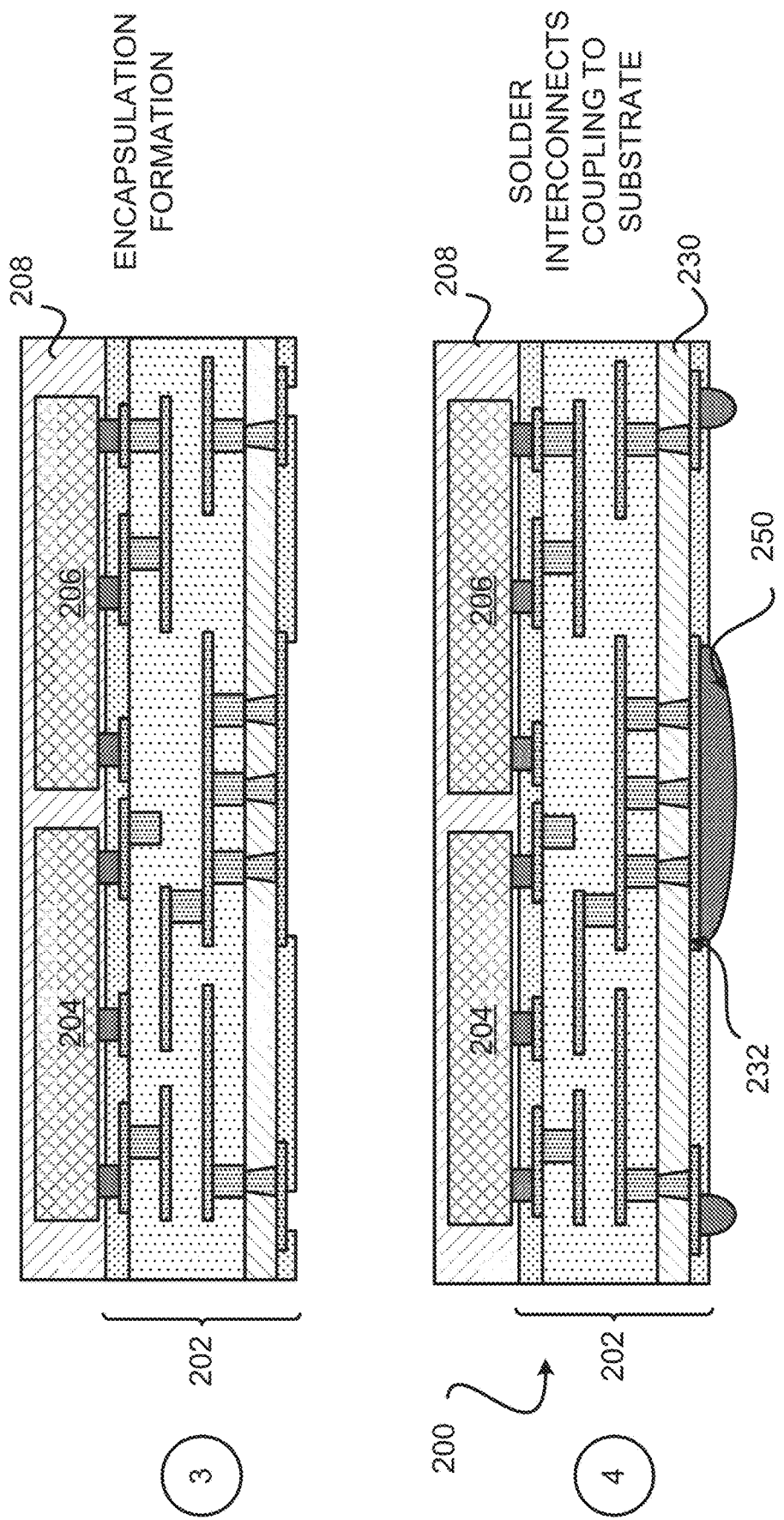

Exemplary Sequence for Fabricating a Package that Includes a Substrate Comprising a Stress Buffer Layer FIGS. 10A-10B illustrate an exemplary sequence for providing or fabricating package comprising a substrate that includes a stress buffer layer. In some implementations, the sequence of FIGS. 10A-10B may be used to provide or fabricate the package 200 of FIG. 2, or any of the packages described in the disclosure.

It should be noted that the sequence of FIGS. 10A-10B may combine one or more stages in order to simplify and/or clarify the sequence for providing or fabricating the package comprising a substrate that includes a stress buffer layer. In some implementations, the order of the processes may be changed or modified. In some implementations, one or more of processes may be replaced or substituted without departing from the scope of the disclosure.

Stage 1, as shown in FIG. 10A, illustrates a state after a substrate 202 is provided. The substrate 202 includes at least one dielectric layer 220, a plurality of interconnects 222, a buffer dielectric layer 230, a plurality of buffer interconnects 232, a first solder resist layer 224, and a second solder resist layer 226. FIGS. 7A-7F illustrate an example of fabricating the substrate 202.

Stage 2 illustrates a state after a first integrated device 204 is coupled to the substrate 202 through a plurality of solder interconnects 240. The first integrated device 204 is coupled to a first surface of the substrate 202. Stage 2 also illustrates a second integrated device 206 coupled to the substrate 202 through a plurality of solder interconnects 260. The second integrated device 206 is coupled to a first surface of the substrate 202. A reflow process may be used to couple the first integrated device 204 and the second integrated device 206 to the substrate 202. The plurality of solder interconnects 240 and the plurality of solder interconnects 260 are coupled to the plurality of interconnects 222 of the substrate 202.

Stage 3, as shown in FIG. 10B, illustrates a state after an encapsulation layer 208 is formed over the substrate 202. The encapsulation layer 208 is formed over the first surface of the substrate 202 (e.g., over the first solder resist layer 224 of the substrate 2020) such that the encapsulation layer 208 encapsulates the first integrated device 204 and/or the second integrated device 206. Different implementations may provide the encapsulation layer 208 differently. For example, a compression and transfer molding process, a sheet molding process, or a liquid molding process may be used to provide and form the encapsulation layer 208.

Stage 4 illustrates a state after a plurality of solder interconnects 250 are coupled to the substrate 202. In particular, Stage 4 illustrates a state after the plurality of solder interconnects 250 is coupled to the plurality of buffer interconnects 232 of the buffer dielectric layer 230. In this example, the plurality of solder interconnects is coupled to a second surface of the substrate 202. Stage 4 may illustrate an example of the package 200 of FIG. 2. In some implementations, the package 200 is part of a wafer, and singulation may be performed to cut the wafer into individual packages.

Figure 11:
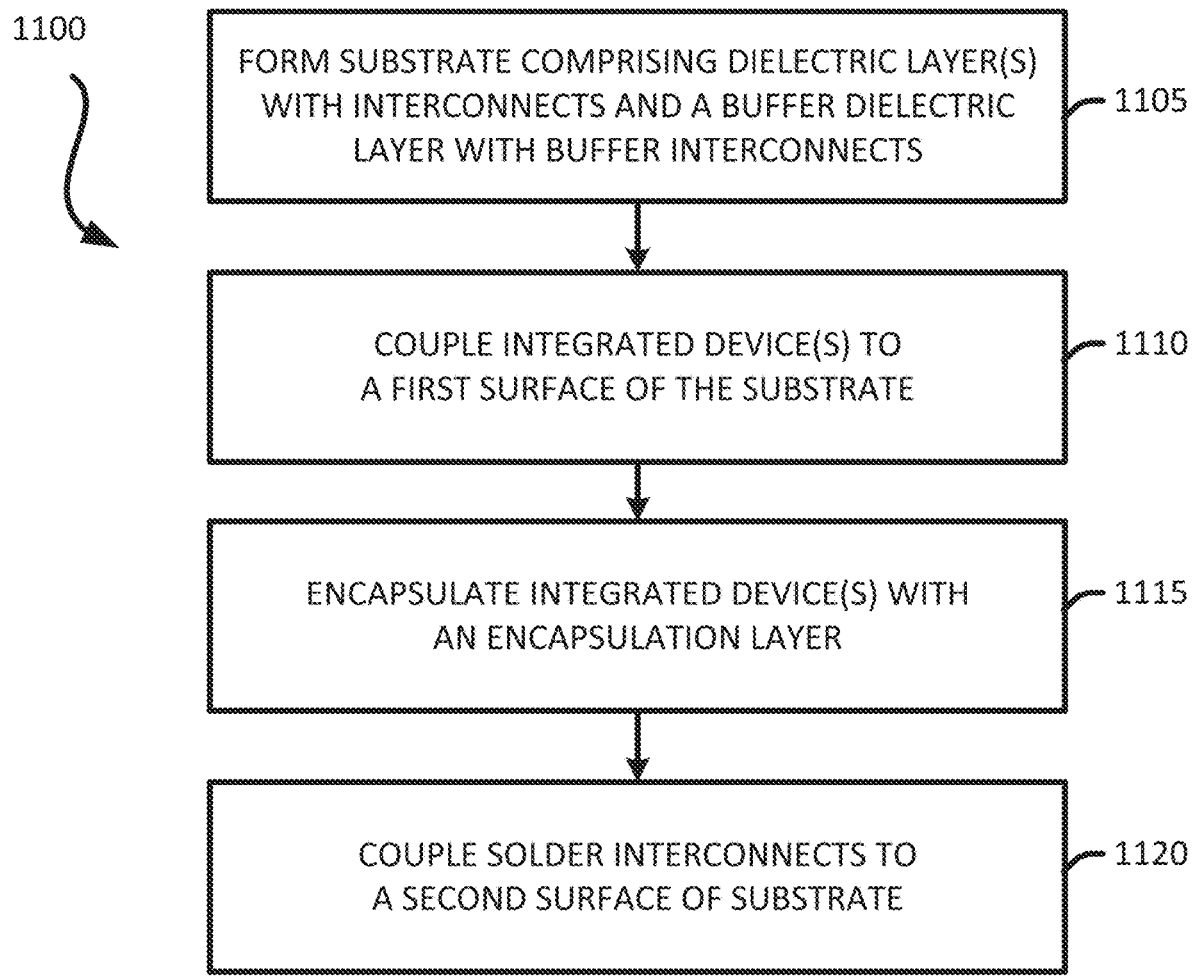
FIG. 11 illustrates an exemplary flow diagram of a method for fabricating a package that includes a substrate having a stress buffer layer.

Exemplary Flow Diagram of a Method for Fabricating a Package that Includes a Substrate Comprising a Stress Buffer Layer In some implementations, fabricating a package comprising a substrate that includes a stress buffer layer includes several processes. FIG. 11 illustrates an exemplary flow diagram of a method 1100 for providing or fabricating a package comprising a substrate that includes a stress buffer layer. In some implementations, the method 1100 of FIG. 11 may be used to provide or fabricate the package of FIG. 2 described in the disclosure. However, the method 1100 may be used to provide or fabricate any of the packages described in the disclosure.

It should be noted that the sequence of FIG. 11 may combine one or more processes in order to simplify and/or clarify the method for providing or fabricating a package comprising a substrate that includes a stress buffer layer. In some implementations, the order of the processes may be changed or modified.

The method provides (at 1105) a substrate (e.g., 202) that includes dielectric layers with interconnects and at least one buffer dielectric layer with buffer interconnects. For example, the substrate that is provided may include at least one dielectric layer 220, a plurality of interconnects 222, a buffer dielectric layer 230, a plurality of buffer interconnects 232, a first solder resist layer 224, and a second solder resist layer 226. In some implementations, the substrate may include the buffer dielectric layer 630 and the plurality of buffer interconnects 632.

The method couples (at 1110) one or more integrated devices to the substrate (e.g., first surface of the substrate). For example, a first integrated device 204 may be coupled to the substrate 202 through a plurality of solder interconnects 240. A second integrated device 206 may be coupled to the substrate 202 through a plurality of solder interconnects 260. A reflow process may be used to couple the first integrated device 204 and the second integrated device 206 to the substrate 202. The plurality of solder interconnects 240 and the plurality of solder interconnects 260 are coupled to the plurality of interconnects 222 of the substrate 202.

The method encapsulates (at 1115) the integrated device (e.g., 204, 206) with an encapsulation layer (e.g., 208). The encapsulation layer 208 may be formed over the substrate 202. For example, the encapsulation layer 208 may be formed over the first surface of the substrate 202 (e.g., over the first solder resist layer 224 of the substrate 202) such that the encapsulation layer 208 encapsulates the first integrated device 204 and/or the second integrated device 206. Different implementations may provide the encapsulation layer 208 differently. For example, a compression and transfer molding process, a sheet molding process, or a liquid molding process may be used to provide and form the encapsulation layer 208.

The method couples (at 1120) the plurality of solder interconnects (e.g., 250) to a second surface of the substrate (e.g., 202). For example, the plurality of solder interconnects 250 is coupled to the plurality of buffer interconnects 232 of the buffer dielectric layer 230 of the substrate 202. In some implementations, the package is part of a wafer, and the method may perform singulation to cut the wafer into individual packages. The package (e.g., 200, 400, 500, 600) may then be coupled to a board (e.g., 290) through the plurality of solder interconnects 250.

Exemplary Package Comprising a Substrate Having a Stress Buffer Layer

Figure 12:
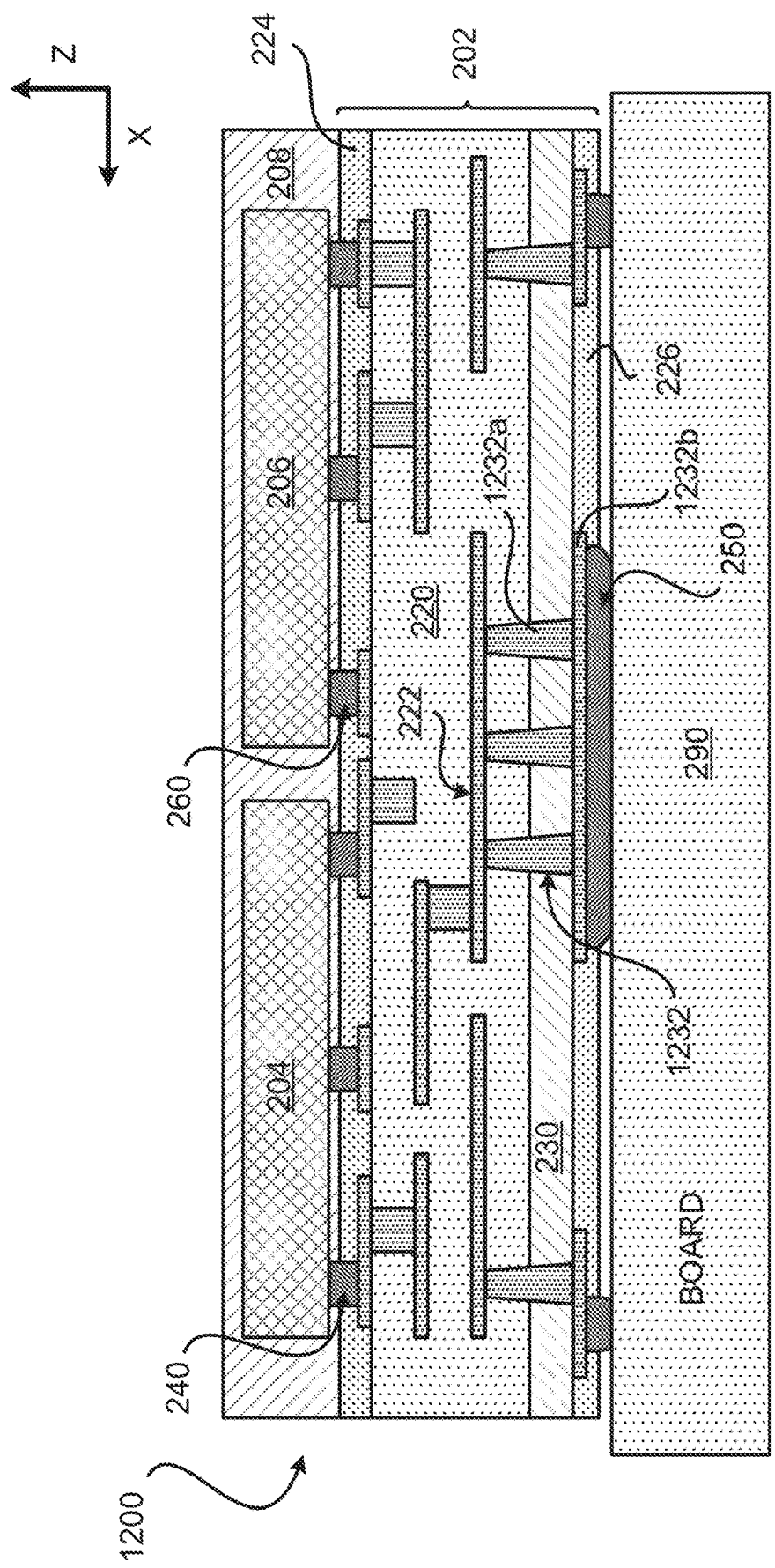
FIG. 12 illustrates a profile view of another package that includes a substrate having a stress buffer layer.

As mentioned above, different implementations may include different configurations and/or arrangements of materials and/or components. FIG. 12 illustrates a profile view of a package 1200 that includes a substrate that comprises a stress buffer layer. The package 1200 may be similar to the package 200 of FIG. 2, and thus the package 1200 includes similar components as the package 200. The package 1200 includes the substrate 202, the first integrated device 204, the second integrated device 206 and the encapsulation layer 208. The substrate 202 includes at least one dielectric layer 220, a plurality of interconnects 222, a first solder resist layer 224, a second solder resist layer 226, a buffer dielectric layer 230, and a plurality of buffer interconnects 1232. As shown in FIG. 12, some of the buffer interconnects from the plurality of buffer interconnects 1232 may be located in the at least one dielectric layer 220 and the buffer dielectric layer 230. For example, the via 1232*a* is located in the at least one dielectric layer 220 and the buffer dielectric layer 230. The via 1232*a* may be coupled to an interconnect from the plurality of interconnects 222 and the pad 1232*b*. The process of fabricating the via 1232*a* may include creating a cavity in the buffer dielectric layer 230 and the at least one dielectric layer 220 (e.g., in a single step). Thus, for example, at Stage 20 of FIG. 7E, the cavity 740 may be formed in the buffer dielectric layer 230 and the at least one dielectric layer 220, to create the via 1232*a*. It is noted that the via 1232*a* that is described in FIG. 12 may be implemented in any of the packages (e.g., 200, 400, 500, 600) described in the disclosure. For instance, where there is a top buffer dielectric layer (e.g., 630), an interconnect (e.g., via) may be implemented such that the interconnect is located in the top buffer dielectric layer (e.g., 630) and the at least one dielectric layer (e.g., 220).

Exemplary Electronic Devices

Figure 13:
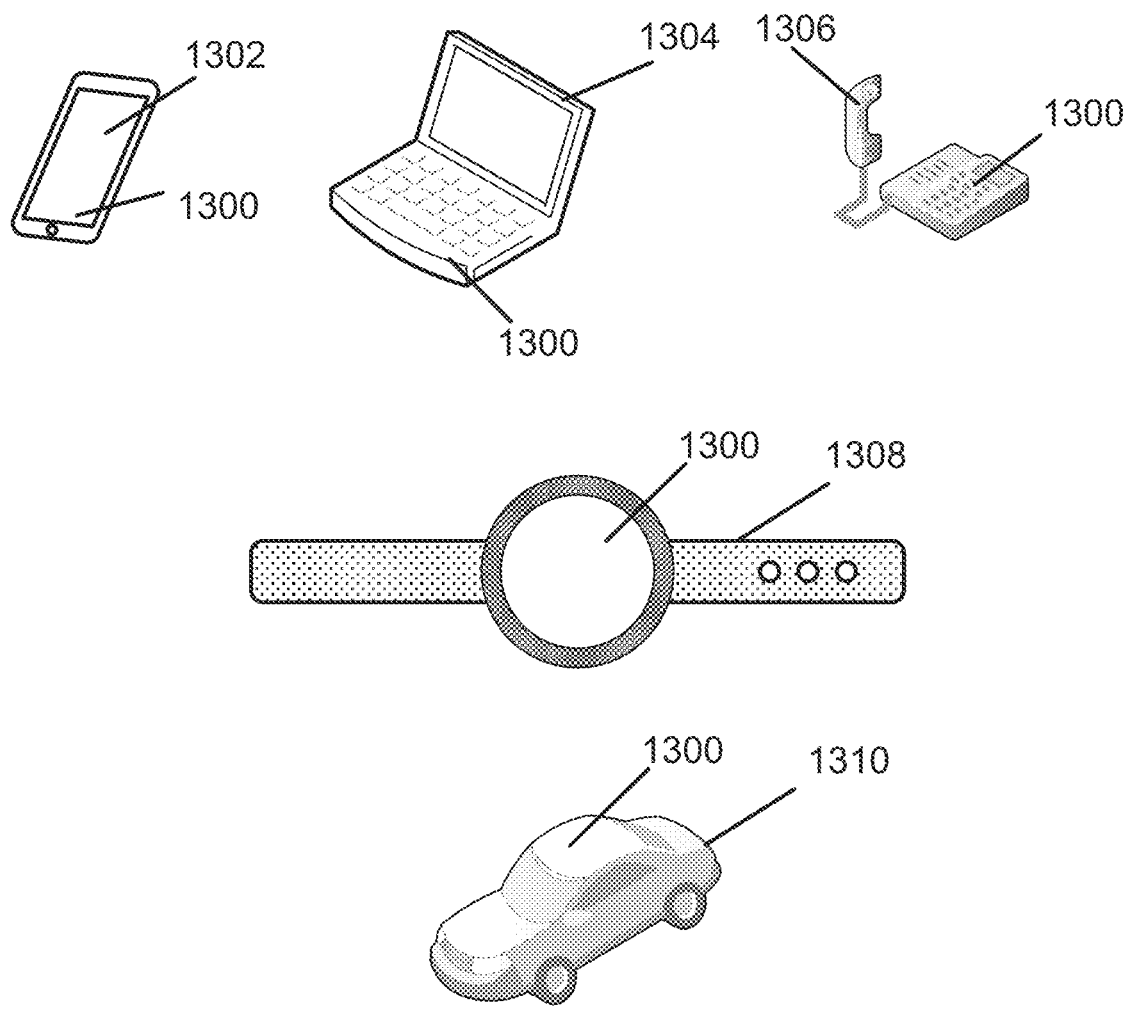
FIG. 13 illustrates various electronic devices that may integrate a die, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7F, 8A-8C, 9, 10A-10B and/or 11-13 may be rearranged and/or combined into a single component, process, feature or function or embodied in several components, processes, or functions. Additional elements, components, processes, and/or functions may also be added without departing from the disclosure. It should also be noted FIGS. 2-6, 7A-7F, 8A-8C, 9, 10A-10B and/or 11-13 and its corresponding description in the present disclosure is not limited to dies and/or ICs. In some implementations, FIGS. 2-6, 7A-7F, 8A-8C, 9, 10A-10B and/or 11-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1. It is noted that the disclosure describes the CTEs of the various materials in terms of part per million per Kelvin (ppm/K). However, the CTEs of the various materials may be expressed as part per million per degree (ppm/C).

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following further examples are described to facilitate the understanding of the disclosure.

In a first example a package, is described, the package comprising an integrated device, a substrate coupled to the integrated device, the substrate comprising at least one dielectric layer, a plurality of interconnects located in the at least one dielectric layer, a buffer dielectric layer coupled to the at least one dielectric layer and a buffer interconnect located at least in the buffer dielectric layer and an encapsulation layer coupled to the substrate such that the encapsulation layer encapsulates the integrated device. The buffer dielectric layer may be configured to absorb stress being applied on the package. The at least one dielectric layer may comprise ceramic, and wherein the buffer dielectric layer may comprise a polymer. The at least one dielectric layer may comprise a low temperature co-fired ceramic (LTCC), high temperature co-fired ceramic (HTCC), AlN, ZincOxide, and/or combinations thereof. The buffer dielectric layer may comprise a Young's Modulus value of approximately 10 gigapascal (Gpa) or less. The at least one dielectric layer may comprise a Young's Modulus value of approximately 100-180 gigapascals (Gpa), wherein the at least one dielectric layer may comprise a coefficient of thermal expansion (CTE) of approximately 3-13 part per million per Kelvin (ppm/K), wherein the buffer dielectric layer may comprise a Young's Modulus value of approximately 10 gigapascal (Gpa) or less, and wherein the buffer dielectric layer may comprise a coefficient of thermal expansion (CTE) of approximately 16-20 part per million per Kelvin (ppm/K). The integrated device may be a silicon based integrated device that includes a coefficient of thermal expansion (CTE) of approximately 2.6 part per million per Kelvin (ppm/K), wherein the at least one dielectric layer may comprise a coefficient of thermal expansion (CTE) of approximately 3-13 part per million per Kelvin (ppm/K), and wherein the buffer dielectric layer may comprise a coefficient of thermal expansion (CTE) of approximately 16-20 part per million per Kelvin (ppm/K). The buffer interconnect may include a via that is located at least in the buffer dielectric layer and the at least one dielectric layer. The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, and/or combinations thereof. The package may be incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

In yet another example, a substrate is described, the substrate comprising at least one dielectric layer, a plurality of interconnects located in the at least one dielectric layer, a buffer dielectric layer coupled to the at least one dielectric layer, and a buffer interconnect located at least in the buffer dielectric layer. The buffer dielectric layer may be configured to absorb stress being applied on the substrate. The at least one dielectric layer may comprise ceramic, and the buffer dielectric layer may comprise a polymer. The at least one dielectric layer may comprise a low temperature co-fired ceramic (LTCC), high temperature co-fired ceramic (HTCC), AlN, ZincOxide, and/or combinations thereof. The buffer dielectric layer may comprise a Young's Modulus value of approximately 10 gigapascal (Gpa) or less. The at least one dielectric layer may comprise a Young's Modulus value of approximately 100-180 gigapascals (Gpa), wherein the at least one dielectric layer may comprise a coefficient of thermal expansion (CTE) of approximately 3-13 part per million per Kelvin (ppm/K), wherein the buffer dielectric layer may comprise a Young's Modulus value of approximately 10 gigapascal (Gpa) or less, and wherein the buffer dielectric layer may comprise a coefficient of thermal expansion (CTE) of approximately 16-20 part per million per Kelvin (ppm/K).

In yet another example, an apparatus is described, the apparatus comprising an integrated device, a substrate coupled to the integrated device, the substrate comprising at least one dielectric layer, a plurality of interconnects located in the at least one dielectric layer, means for stress buffering coupled to the at least one dielectric layer and a buffer interconnect located at least in the means for stress buffering and means for encapsulation coupled to the substrate such that the means for encapsulation encapsulates the integrated device. The means for stress buffering may be configured to absorb stress being applied on the substrate. The at least one dielectric layer may comprise ceramic, and wherein the means for stress buffering may comprise a polymer. The at least one dielectric layer may comprise a low temperature co-fired ceramic (LTCC), a high temperature co-fired ceramic (HTCC), AlN, ZincOxide, and/or combinations thereof. The at least one dielectric layer may comprise a Young's Modulus value of approximately 100-180 gigapascals (Gpa), The at least one dielectric layer may comprise a coefficient of thermal expansion (CTE) of approximately 3-13 part per million per Kelvin (ppm/K), wherein the means for stress buffering may comprise a Young's Modulus value of approximately 10 gigapascal (Gpa) or less, and wherein the means for stress buffering may comprise a coefficient of thermal expansion (CTE) of approximately 16-20 part per million per Kelvin (ppm/K). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, and/or combinations thereof. The apparatus may be incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

In yet another example, a method for fabricating a substrate is described, the method comprising: forming at least one dielectric layer, forming a plurality of interconnects in and over the at least one dielectric layer, forming a buffer dielectric layer over the at least one dielectric layer and forming a buffer interconnect in the buffer dielectric layer. The buffer dielectric layer may be configured to absorb stress being applied on the substrate. Wherein forming the at least one dielectric layer may comprise forming a dielectric layer that includes ceramic, and wherein forming a buffer dielectric layer may comprise forming another dielectric layer that includes polymer. Wherein forming the at least one dielectric layer may comprise forming a dielectric layer that includes a low temperature co-fired ceramic (LTCC), high temperature co-fired ceramic (HTCC), AlN, ZincOxide, and/or combinations thereof. The buffer dielectric layer may comprise a Young's Modulus value of approximately 10 gigapascal (Gpa) or less. The at least one dielectric layer may comprise a Young's Modulus value of approximately 100-180 gigapascals (Gpa), wherein the at least one dielectric layer may comprise a coefficient of thermal expansion (CTE) of approximately 3-13 part per million per Kelvin (ppm/K), wherein the buffer dielectric layer may comprise a Young's Modulus value of approximately 10 gigapascal (Gpa) or less, and wherein the buffer dielectric layer may comprise a coefficient of thermal expansion (CTE) of approximately 16-20 part per million per Kelvin (ppm/K).

The invention claimed is:

1. A package comprising:
   an integrated device;
   a substrate coupled to the integrated device, the substrate comprising:
      at least one dielectric layer comprising a Young's Modulus value of approximately 100-180 gigapascals (Gpa) and a coefficient of thermal expansion (CTE) of approximately 3-13 part per million per Kelvin (ppm/K);
      a plurality of interconnects located in the at least one dielectric layer;
      a buffer dielectric layer coupled to the at least one dielectric layer, the buffer dielectric layer comprising a Young's Modulus value of approximately 10 gigapascal (Gpa) or less and a coefficient of thermal expansion (CTE) of approximately 16-20 part per million per Kelvin (ppm/K; and
      a buffer interconnect located at least in the buffer dielectric layer; and
   an encapsulation layer coupled to the substrate, wherein the encapsulation layer encapsulates the integrated device.

2. The package of claim 1, wherein the buffer dielectric layer is configured to absorb stress being applied on the package.

3. The package of claim 1,
   wherein the at least one dielectric layer comprises ceramic, and
   wherein the buffer dielectric layer comprises a polymer.

4. The package of claim 1, wherein the at least one dielectric layer comprises a low temperature co-fired ceramic (LTCC), high temperature co-fired ceramic (HTCC), AlN, ZincOxide, and/or combinations thereof.

5. The package of claim 1, wherein the buffer interconnect includes a via that is located in the buffer dielectric layer and the at least one dielectric layer.

6. The package of claim 1, wherein the integrated device includes a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, and/or combinations thereof.

7. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

8. A package comprising:
   an integrated device, the integrated device is a silicon based integrated device that includes a coefficient of thermal expansion (CTE) of approximately 2.6 part per million per Kelvin (ppm/K);
   a substrate coupled to the integrated device, the substrate comprising:
      at least one dielectric layer comprising a coefficient of thermal expansion (CTE) of approximately 3-13 part per million per Kelvin (ppm/K);
      a plurality of interconnects located in the at least one dielectric layer;
      a buffer dielectric layer comprising a coefficient of thermal expansion (CTE) of approximately 16-20 part per million per Kelvin (ppm/K); and
      a buffer interconnect located at least in the buffer dielectric layer; and
   an encapsulation layer coupled to the substrate, wherein the encapsulation layer encapsulates the integrated device.

9. A substrate comprising:
   at least one dielectric layer comprising a Young's Modulus value of approximately 100-180 gigapascals (Gpa) and a coefficient of thermal expansion (CTE) of approximately 3-13 part per million per Kelvin (ppm/K);
   a plurality of interconnects located in the at least one dielectric layer;
   a buffer dielectric layer coupled to the at least one dielectric layer, the buffer dielectric layer comprising a Young's Modulus value of approximately 10 gigapascal (Gpa) or less and a coefficient of thermal expansion (CTE) of approximately 16-20 part per million per Kelvin (ppm/K); and
   a buffer interconnect located at least in the buffer dielectric layer.

10. The substrate of claim 9,
   wherein the Young's Modulus value and the coefficient of thermal expansion (CTE) for the at least one dielectric layer, and/or the Young's Modulus value and the coefficient of thermal expansion (CTE) for the buffer dielectric layer are configured to prevent cracks in the package.

11. The substrate of claim 9,
wherein the at least one dielectric layer comprises ceramic, and
wherein the buffer dielectric layer comprises at least one buffer dielectric layer that includes a polymer.

12. The substrate of claim 9, wherein the at least one dielectric layer comprises a low temperature co-fired ceramic (LTCC), high temperature co-fired ceramic (HTCC), AlN, ZincOxide, and/or combinations thereof.

13. An apparatus comprising:
an integrated device;
a substrate coupled to the integrated device, the substrate comprising:
at least one dielectric layer comprising a Young's Modulus value of approximately 100-180 gigapascals (Gpa) and a coefficient of thermal expansion (CTE) of approximately 3-13 part per million per Kelvin (ppm/K);
a plurality of interconnects located in the at least one dielectric layer;
means for stress buffering coupled to the at least one dielectric layer, the means for stress buffering comprising a Young's Modulus value of approximately 10 gigapascal (Gpa) or less and a coefficient of thermal expansion (CTE) of approximately 16-20 part per million per Kelvin (ppm/K); and
a buffer interconnect located at least in the means for stress buffering; and
means for encapsulation coupled to the substrate, wherein the means for encapsulation encapsulates the integrated device.

14. The apparatus of claim 13, wherein the means for stress buffering is configured to absorb stress being applied on the substrate.

15. The apparatus of claim 13,
wherein the at least one dielectric layer comprises ceramic, and
wherein the means for stress buffering comprises a polymer.

16. The apparatus of claim 13, wherein the at least one dielectric layer comprises a low temperature co-fired ceramic (LTCC), a high temperature co-fired ceramic (HTCC), AlN, ZincOxide, and/or combinations thereof.

17. The apparatus of claim 13, wherein the integrated device includes a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, and/or combinations thereof.

18. The apparatus of claim 13, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. A method for fabricating a substrate, comprising:
forming at least one dielectric layer having a Young's Modulus value of approximately 100-180 gigapascals (Gpa) and a coefficient of thermal expansion (CTE) of approximately 3-13 part per million per Kelvin (ppm/K);
forming a plurality of interconnects in and over the at least one dielectric layer;
forming a buffer dielectric layer over the at least one dielectric layer, the buffer dielectric layer having a Young's Modulus value of approximately 10 gigapascal (Gpa) or less, and coefficient of thermal expansion (CTE) of approximately 16-20 part per million per Kelvin (ppm/K); and
forming a buffer interconnect at least in the buffer dielectric layer.

20. The method of claim 19, wherein the buffer dielectric layer is configured to absorb stress being applied on the substrate.

21. The method of claim 19,
wherein forming the at least one dielectric layer comprises forming a dielectric layer that includes ceramic, and
wherein forming a buffer dielectric layer comprises forming another dielectric layer that includes polymer.

22. The method of claim 19, wherein forming the at least one dielectric layer comprises forming a dielectric layer that includes a low temperature co-fired ceramic (LTCC), high temperature co-fired ceramic (HTCC), AlN, ZincOxide, and/or combinations thereof.

23. The method of claim 19, further comprising forming another buffer interconnect over the buffer dielectric layer,
wherein the another buffer interconnect is formed to be coupled to the buffer interconnect, and
wherein the buffer interconnect is formed to be coupled to at least one interconnect from the plurality of interconnects.

* * * * *